(12) United States Patent
Fukami et al.

(10) Patent No.: US 8,787,076 B2
(45) Date of Patent: Jul. 22, 2014

(54) MAGNETIC MEMORY AND METHOD OF MANUFACTURING THE SAME

(75) Inventors: Shunsuke Fukami, Tokyo (JP);
Nobuyuki Ishiwata, Tokyo (JP);
Tetsuhiro Suzuki, Tokyo (JP);
Kiyokazu Nagahara, Tokyo (JP);
Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/061,299

(22) PCT Filed: Aug. 13, 2009

(86) PCT No.: PCT/JP2009/064299
§ 371 (c)(1),
(2), (4) Date: Mar. 24, 2011

(87) PCT Pub. No.: WO2010/026861
PCT Pub. Date: Mar. 11, 2010

(65) Prior Publication Data
US 2011/0163402 A1  Jul. 7, 2011

(30) Foreign Application Priority Data
Sep. 2, 2008 (JP) ................. 2008-224585

(51) Int. Cl.
*G11C 11/14* (2006.01)
*G11C 11/16* (2006.01)
*G11C 19/08* (2006.01)
*H01L 43/08* (2006.01)

(52) U.S. Cl.
USPC .......................................... 365/158; 365/173

(58) Field of Classification Search
CPC .......... G11C 11/15; G11C 11/16; H01L 43/08
USPC ........................... 257/421, E29.323; 365/158
See application file for complete search history.

(56) References Cited

U.S. PATENT DOCUMENTS 6,834,005 B1    12/2004  Parkin
2004/0061983 A1*  4/2004  Childress et al. .......... 360/324.2
(Continued)

FOREIGN PATENT DOCUMENTS

JP    2004-6589 A     1/2004
JP    2004-22138 A    1/2004
(Continued)

OTHER PUBLICATIONS

Koyama et al, "Control of Domain Wall Position by Electrical Current in Structured Co/Ni Wire with Perpendicular Magnetic Anistorpy", Cornell University Library, Aug. 30, 2008.*

(Continued)

*Primary Examiner* — Olik Chaudhuri
*Assistant Examiner* — Christine Enad
(74) *Attorney, Agent, or Firm* — Sughrue Mion, PLLC

(57) ABSTRACT

A magnetic memory according to the present invention has: a first underlayer; a second underlayer so formed on the first underlayer as to be in contact with the first underlayer; and a data storage layer so formed on the second underlayer as to be in contact with the second underlayer. The data storage layer is made of a ferromagnetic material having perpendicular magnetic anisotropy. A magnetization state of the data storage layer is changed by current driven domain wall motion.

11 Claims, 16 Drawing Sheets

(56) References Cited

U.S. PATENT DOCUMENTS

| | | | |
|---|---|---|---|
| 2004/0265639 A1* | 12/2004 | Hintz et al. | 428/694 T |
| 2005/0128794 A1* | 6/2005 | Sussner | 365/158 |
| 2008/0088980 A1* | 4/2008 | Kitagawa et al. | 360/313 |
| 2008/0137405 A1* | 6/2008 | Ohno et al. | 365/173 |
| 2008/0180991 A1* | 7/2008 | Wang | 365/171 |
| 2008/0185101 A1* | 8/2008 | Gaidis et al. | 156/345.3 |
| 2010/0193890 A1* | 8/2010 | Suzuki et al. | 257/421 |

FOREIGN PATENT DOCUMENTS

| | | |
|---|---|---|
| JP | 2005191032 A | 7/2005 |
| JP | 2006073930 A | 3/2006 |
| JP | 2007-201059 A | 8/2007 |
| JP | 2007-273561 A | 10/2007 |
| JP | 2008098523 A | 4/2008 |
| JP | 2008-109118 A | 5/2008 |

OTHER PUBLICATIONS

Zhang et al, "Anisotropy and Magneto Optical Properties of Sputtered Co/Ni Multilayer Thin Films" IEEE Transactions on Magnetics, vol. 30, No. 6, Nov. 1994.*

International Search Report for PCT/JP2009/064299 mailed Nov. 17, 2009.

N. Sakimura et al., "MRAM Cell Technology for Over 500-MHz SoC", IEEE Journal of Solid-State Circuits, vol. 42, No. 4, Apr. 2007, pp. 830-838.

A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1~4.

S. Fukami et al., "Micromagnetic analysis of curent drven domain wall moton in nanostrips with perpendicular magnetic anisotropy", Journal of Applied Physics, vol. 103, 2008, pp. 07E718-1~3.

A. Thiaville et al., "Domain wall motion by spin-polarized current: a mic romagnetic study", Journal of Applied Physics, vol. 95, No. 11, Jun. 1, 2004, pp. 7049-7051.

G. H. O. Daalderop et al., "Prediction and Confirmation of Perpendicular Magnetic Anisotropy in Co/Ni Multilayers", Physical Review Letters, vol. 68, No. 5, Feb. 3, 1992. pp. 682-685.

F. J. A. Den Broeder et al., "Perpendicular Magnetic Anisotropy and Coercivity of Co/Ni Multilayers", IEEE Transactions on Magnetics, vol. 28, No. 5, Sep. 1992, pp. 2760-2765.

S. Fukami et al., "Intrinsic threshold current density of domain wall motion in nano-strips with perpendicular magnetic anisotropy for use in low-write-current MRAMs", International Magnetic Conference, Intermag 2008, Technical Digest, Paper No. HH-11.

Japanese Office Action for JP Application No. 2010-527743 mailed on Oct. 1, 2013 with English Translation.

Japanese Office Action for JP Application No. 2010-527743 mailed on Jan. 31, 2014 with partial English Translation.

* cited by examiner

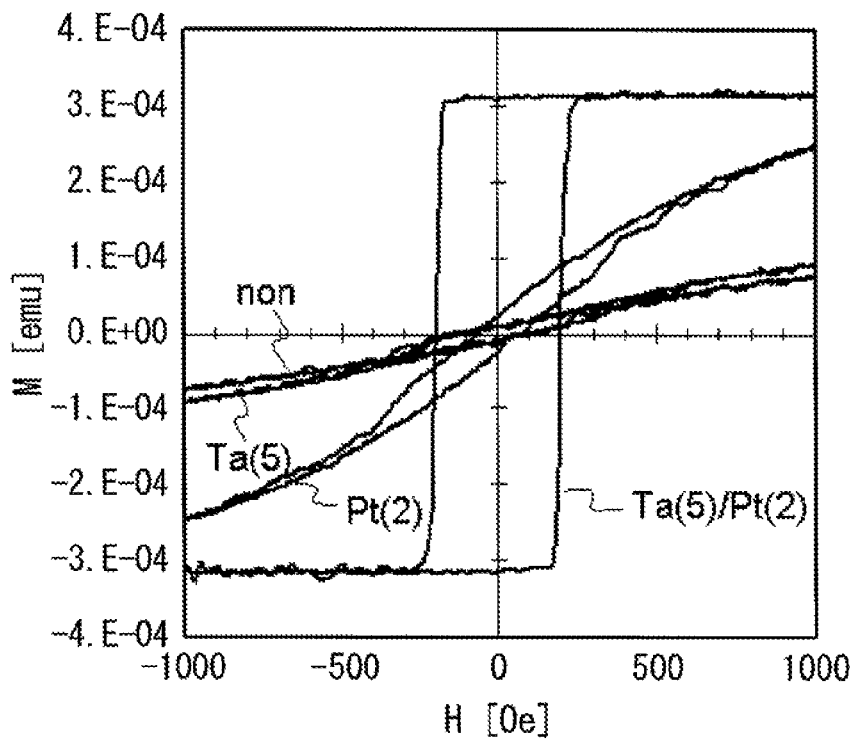
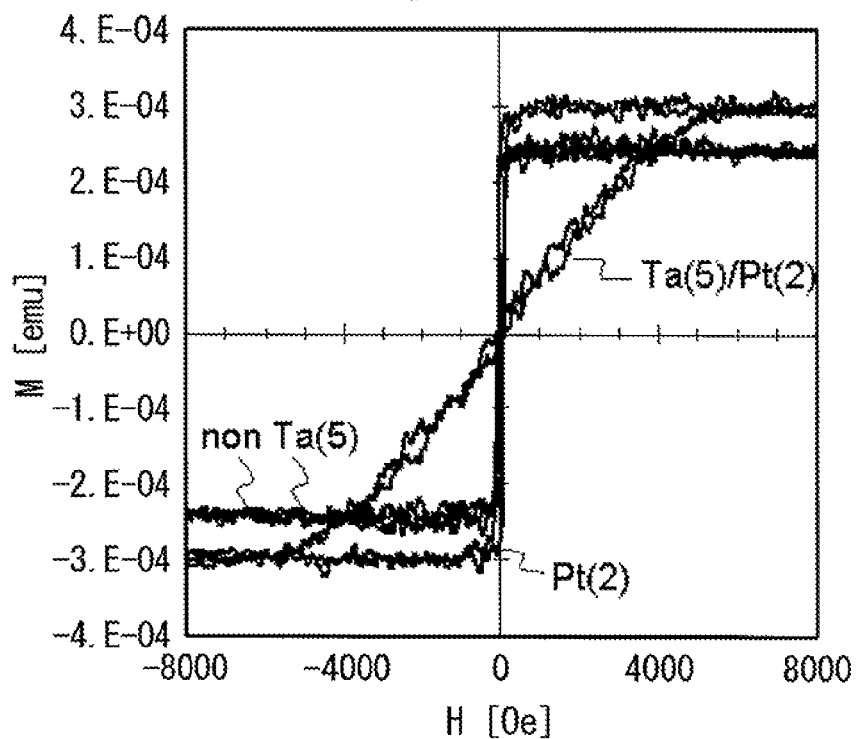

MAGNETIC MEMORY AND METHOD OF MANUFACTURING THE SAME

TECHNICAL FIELD

The present invention relates to a magnetic memory and a method of manufacturing the same. In particular, the present invention relates to a magnetic memory that utilizes current driven domain wall motion and is provided with a data storage layer having perpendicular magnetic anisotropy, and a method of manufacturing the same.

BACKGROUND ART

A magnetic memory, particularly a magnetic random access memory (Magnetic Random Access Memory; MRAM) is a nonvolatile memory capable of a high speed operation and an infinite number of rewritings. Therefore, some MRAMs are put into practical use, and development is carried out for further improving versatility. The MRAM uses a magnetic material as a memory element and stores a data with associating it with a magnetization direction of the magnetic material. In order to write a desired data to the memory element, the magnetization of the magnetic material is switched to a direction associated with the data. Although several methods have been proposed as a method of switching the magnetization direction, all of them are common with regard to the used of a current (hereinafter referred to as a "write current"). In putting the MRAM into the practical use, how much the write current can be reduced is very important.

According to Non Patent Literature 1 (N. Sakimura et al., MRAM Cell Technology for Over 500-MHz SoC, IEEE JOURNAL OF SOLID-STATE CIRCUITS, VOL. 42, NO. 4, pp. 830-838, 2007.), an equivalent cell area to that of an existing embedded SRAM can be achieved by reducing the write current to 0.5 mA or less.

The most typical one of data write methods to the MRAM is to dispose an interconnection for the writing in the vicinity of the magnetic memory element, to generate a magnetic field by flowing the write current through the interconnection, and to switch the magnetization direction of the magnetic memory element by using the magnetic field. This method is preferable in attaining the high speed MRAM, because the data write in one nanosecond or less can be achieved in principle. However, a magnetic field necessary for switching the magnetization of magnetic material which has sufficient thermal stability and resistance against external magnetic field disturbance is typically several ten Oe (oersteds), and a large write current around several mA is required to generate such a large magnetic field. In this case, the chip area is inevitably increased and power consumption required for the writing also is increased, which causes poor competitiveness as compared with other random access memories. In addition, the write current is further increased as the element is miniaturized, which is undesirable from a viewpoint of scaling property.

In recent years, the following two approaches have been proposed for solving such problems.

The first approach is a spin torque transfer method. According to the spin torque transfer method, a laminated film comprises a first magnetic layer having a reversible magnetization and a second magnetic layer electrically connected to it and whose magnetization direction is fixed, and a write current is supplied between the second magnetic layer and the first magnetic layer in the laminated film. At this time, the magnetization of the first magnetic layer can be reversed by an interaction between spin-polarized conduction electrons and localized electrons in the first magnetic layer. At a time of data read, a magnetoresistive effect occurring between the first magnetic layer and the second magnetic layer is utilized. Therefore, the magnetic memory element using the spin torque transfer is a two-terminal element. Since the spin torque transfer is caused when a current density is higher than a certain value, the current required for the data write is reduced as an element size becomes smaller. That is, the spin torque transfer method can be said to be superior in the scaling property. However, in general, an insulating layer is provided between the first magnetic layer and the second magnetic layer, and thus a comparatively large write current needs to flow penetrating through the insulating layer at the time of data write. This causes a problem of rewriting durability and reliability. Moreover, a write current path and a read current path are the same, and this may cause an erroneous data write in the data read. As thus described, there are several obstacles in attaining the practical use of the spin torque transfer, although the spin torque transfer is superior in the scaling property.

The second approach is a current driven domain wall motion method. The MRAM which utilizes the current driven domain wall motion is disclosed, for example, in Patent Literature 1 (Japanese Patent Publication JP-2005-191032). In a typical current driven domain wall motion MRAM, a magnetic layer (data storage layer) having a reversible magnetization is provided, and respective magnetizations of both end sections of the data storage layer are so fixed as to be anti-parallel to each other. Due to this magnetization configuration, a domain wall is introduced within the data storage layer. When a current is supplied in a direction that passes through the domain wall, the domain wall is moved in the direction of conduction electrons, as reported in Non Patent Literature 2 (A. Yamaguchi et al., Real-Space Observation of Current-Driven Domain Wall Motion in Submicron Magnetic Wires, PHYSICAL REVIEW LETTERS, VOL. 92, NO. 7, 077205, 2004). Therefore, by supplying a write current in an in-plane direction in the data storage layer, it is possible to move the domain wall in a direction depending on the current direction and thus to write a desired data. At a time of data read, a magnetic tunnel junction including a region in which the domain wall moves is used and the data read is performed based on the magnetoresistive effect. Therefore, the magnetic memory element using the current driven domain wall motion is a three-terminal element. Moreover, the current driven domain wall motion also is caused when a current density is higher than a certain value, as in the case of the spin torque transfer. Therefore, the current driven domain wall motion method also can be said to be superior in the scaling property. In addition to that, in the case of the current driven domain wall motion method, the write current does not flow through an insulating layer, and a write current path and a read current path are separated from each other. Therefore, the above-mentioned problems in the case of the spin torque transfer can be solved.

It should be noted that according to the above-mentioned Non Patent Literature 2, it is reported that the current density required for the current driven domain wall motion is about $1 \times 10^8$ [A/cm2].

Non Patent Literature 3 (S. Fukami et al., Micromagnetic analysis of current driven domain wall motion in nanostrips with perpendicular magnetic anisotropy, JOURNAL OF APPLIED PHYSICS, VOL. 103, 07E718, 2008.) describes effectiveness of perpendicular magnetic anisotropy material with respect to the current driven domain wall motion method. More specifically, it has been revealed through a micromagnetic simulation that the write current can be reduced sufficiently in a case where the data storage layer in which the domain wall motion occurs has the perpendicular magnetic anisotropy.

CITATION LIST

Patent Literature

[Patent Literature 1] Japanese Patent Publication JP-2005-191032
[Patent Literature 2] U.S. Pat. No. 6,834,005

Non Patent Literature

[Non Patent Literature 1] N. Sakimura et al., MRAM Cell Technology for Over 500-MHz SoC, IEEE JOURNAL OF SOLID-STATE CIRCUITS, VOL. 42, NO. 4, pp. 830-838, (2007).
[Non Patent Literature 2] A. Yamaguchi et al., Real-Space Observation of Current-Driven Domain Wall Motion in Submicron Magnetic Wires, PHYSICAL REVIEW LETTERS, VOL. 92, NO. 7, 077205, (2004).
[Non Patent Literature 3] S. Fukami et al., Micromagnetic analysis of current driven domain wall motion in nanostrips with perpendicular magnetic anisotropy, JOURNAL OF APPLIED PHYSICS, VOL. 103, 07E718, (2008).
[Non Patent Literature 4] A. Thiaville et al., Domain wall motion by spin-polarized current: a micromagnetic study, JOURNAL OF APPLIED PHYSICS, VOL. 95, NO. 11, pp. 7049-7051, (2004).
[Non Patent Literature 5] G. H. O. Daalderop et al., Prediction and Confirmation of Perpendicular Magnetic Anisotropy in Co/Ni Multilayers, PHYSICAL REVIEW LETTERS, VOL. 68, NO. 5, pp. 682-685, (1992).
[Non Patent Literature 6] F. J. A. den Broeder et al., Perpendicular Magnetic Anisotropy and Coercivity of Co/Ni Multilayers, IEEE TRANSACTIONS ON MAGNETICS, VOL. 28, NO. 5, pp. 2760-2765, (1992).
[Non Patent Literature 7] S. Fukami et al., Intrinsic threshold current density of domain wall motion in nano-strips with perpendicular magnetic anisotropy for use in low-write-current MRAMs, INTERNATIONAL MAGNETIC CONFERENCE, TECHNICAL DIGEST, Paper No. HH-11, (2008).

SUMMARY OF INVENTION

As described above, it has been revealed through the micromagnetic simulation that the write current can be reduced sufficiently small in the case where the data storage layer in which the domain wall motion occurs has the perpendicular magnetic anisotropy. Therefore, to form a ferromagnetic material having the perpendicular magnetic anisotropy as the data storage layer is expected to be preferable for reducing the write current in the magnetic memory utilizing the current driven domain wall motion.

Here, the inventors of the present patent application have recognized the following points. In order to actually manufacture a current driven domain wall motion type magnetic memory and to further reduce the write current, it is necessary to appropriately adjust a material of the data storage layer in which the domain wall motion occurs. More specifically, it is desirable to use a material having small saturation magnetization and large spin polarizability. Furthermore, the perpendicular magnetization must be achieved by using such the material. In other words, it is necessary to achieve crystal orientation such that the perpendicular magnetization can be obtained in the data storage layer.

An object of the present invention is to provide a useful technique for achieving a data storage layer having the perpendicular magnetic anisotropy in the magnetic memory that utilizes the current driven domain wall motion.

A magnetic memory according to the present invention has: a first underlayer; a second underlayer so formed on the first underlayer as to be in contact with the first underlayer; and a data storage layer so formed on the second underlayer as to be in contact with the second underlayer. The data storage layer is made of a ferromagnetic material having perpendicular magnetic anisotropy. A magnetization state of the data storage layer is changed by current driven domain wall motion.

According to the present invention, it is possible to preferably achieve the data storage layer having the perpendicular magnetic anisotropy in the magnetic memory that utilizes the current driven domain wall motion.

BRIEF DESCRIPTION OF DRAWINGS

The above and other objects, advantages and features of the present invention will be more apparent from the following description of certain exemplary embodiments taken in conjunction with the accompanying drawings.

FIG. 8A is a graph showing a result of a measurement of underlayer dependence of a magnetization curve.

FIG. 8B is a graph showing a result of a measurement of underlayer dependence of a magnetization curve.

DESCRIPTION OF EMBODIMENTS

A current driven domain wall motion type magnetic memory and a method of manufacturing the same according to an exemplary embodiment of the present invention will be described with reference to the attached drawings. A magnetic memory according to the present exemplary embodiment has a plurality of magnetic memory cells that are arranged in an array form, and each magnetic memory cell has a magnetic memory element.

1. BASIC STRUCTURE AND PRINCIPLE 1-1. Basic Structure of Magnetic Memory Element First of all, a typical structure of a magnetic memory element to which the present invention can be applied will be described. A typical current driven domain wall motion type magnetic memory element has a data storage layer that stores a data depending on its magnetization state, a read structure for reading out the data stored in the data storage layer, and a current introduction structure for introducing a current to the data storage layer.

Figure 1A:
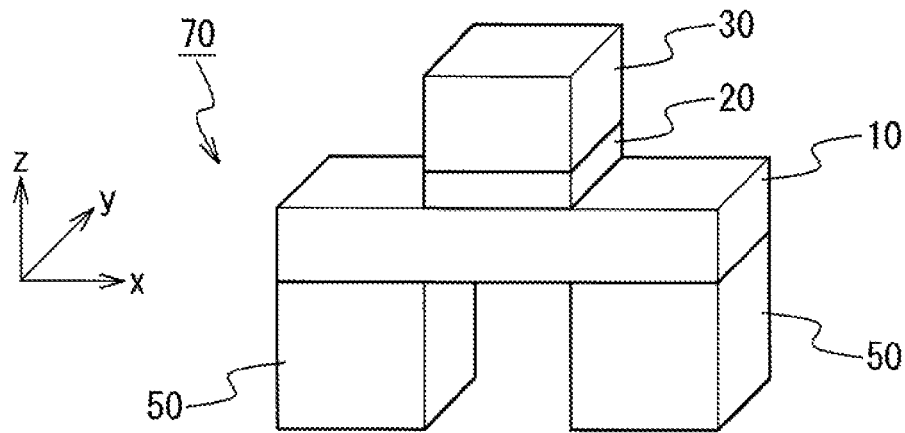
FIG. 1A is a perspective view showing a configuration of a typical magnetic memory element to which the present invention can be applied.

FIGS. 1A to 10 schematically show a structural example of a principal part of a typical magnetic memory element 70. FIG. 1A is a perspective view, FIG. 1B is a side view and FIG. 1C is a plan view. In the x-y-z coordinate system described in the figures, the z-axis represents a direction perpendicular to a substrate, and the x-axis and the y-axis are parallel to the substrate plane. As shown in FIGS. 1A to 1C, the magnetic memory element 70 has a first magnetization free layer 10, a first nonmagnetic layer 20, a first magnetization fixed layer 30 and an electrode layer 50.

Figure 1B:
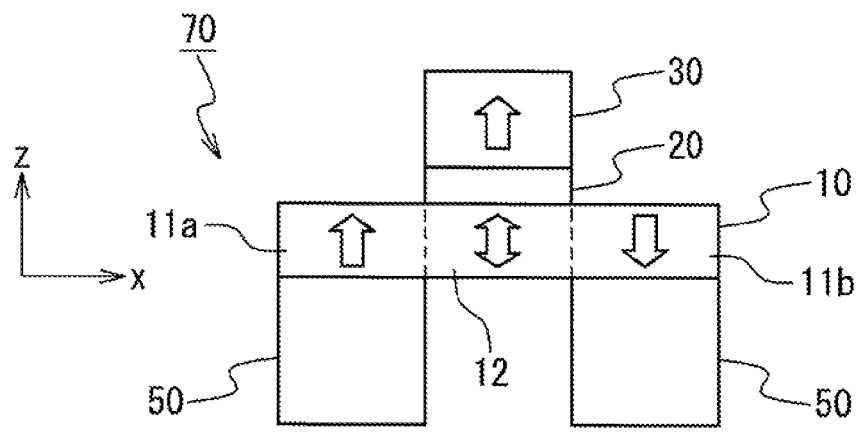
FIG. 1B is a side view of the magnetic memory element shown in FIG. 1A.

The first magnetization free layer 10 is the above-mentioned "data storage layer" and is made of a ferromagnetic material. In particular, according to the present exemplary embodiment, the first magnetization free layer 10 is made of a ferromagnetic material having the perpendicular magnetic anisotropy. Also, the first magnetization free layer 10 includes a region whose magnetization direction is reversible and stores a data depending on its magnetization state. More specifically, the first magnetization free layer 10 has a first magnetization fixed region 11a, a second magnetization fixed region 11b and a magnetization free region 12. The magnetization fixed regions 11a and 11b are located on both sides of the magnetization free region 12, and the magnetization free region 12 is sandwiched between the magnetization fixed regions 11a and 11b. Respective magnetizations of the magnetization fixed regions 11a and 11b are fixed in the opposite directions. That is, the respective magnetization directions of the magnetization fixed regions 11a and 11b are anti-parallel to each other. For example, as shown in FIG. 1B, the magnetization direction of the first magnetization fixed region 11a is fixed in the +z-direction, and the magnetization direction of the second magnetization fixed region 11b is fixed in the −z-direction. On the other hand, the magnetization direction of the magnetization free region 12 is reversible and can be either the +z-direction or the −z-direction. Therefore, a domain wall is formed within the first magnetization free layer 10, depending on the magnetization direction of the magnetization free region 12.

The first nonmagnetic layer 20 is so provided as to be adjacent to the first magnetization free layer 10. In particular, the first nonmagnetic layer 20 is so provided as to be adjacent to at least the magnetization free region 12 of the first magnetization free layer 10. The first nonmagnetic layer 20 is made of a nonmagnetic material, preferably an insulating material.

The first magnetization fixed layer 30 is so provided as to be adjacent to the first nonmagnetic layer 20 on the opposite side of the first magnetization free layer 10. That is, the first magnetization fixed layer 30 is connected to the first magnetization free layer 10 (magnetization free region 12) through the first nonmagnetic layer 20. The first magnetization fixed layer 30 is made of a ferromagnetic material and its magnetization direction is fixed in one direction. Preferably, the first magnetization fixed layer 30 also is made of a ferromagnetic material having the perpendicular magnetic anisotropy, as in the case of the first magnetization free layer 10. In this case, the magnetization direction of the first magnetization fixed layer 30 is fixed in either the +z-direction or the −z-direction. For example, in FIG. 1B, the magnetization direction of the first magnetization fixed layer 30 is fixed in the +z-direction.

The above-described first magnetization free layer 10 (magnetization free region 12), first nonmagnetic layer 20 and first magnetization fixed layer 30 form a magnetic tunnel junction (Magnetic Tunnel Junction; MTJ). Moreover, the first nonmagnetic layer 20 and the first magnetization fixed layer 30 correspond to the "read structure" for reading out the data stored in the first magnetization free layer 10 being the data storage layer, as will be described later.

The electrode layer 50 is electrically connected to the first magnetization free layer 10. In particular, two electrode layers 50 are so provided as to be respectively connected to the magnetization fixed regions 11a and 11b of the first magnetization free layer 10. The electrode layers 50 correspond to the above-mentioned "current introduction structure" and are used for introducing a current to the first magnetization free layer 10 being the data storage layer.

1-2. Magnetization State of Magnetic Memory Element

Figure 1C:
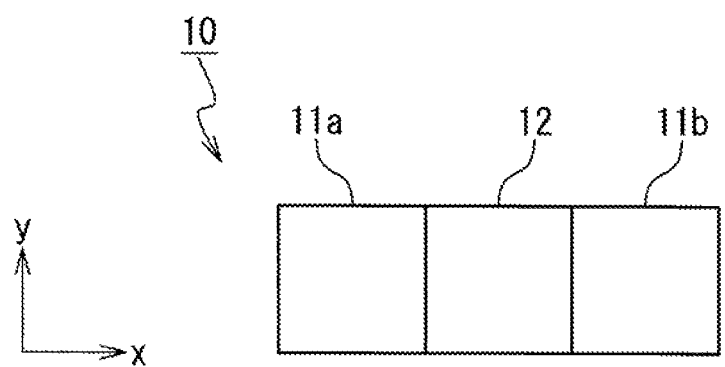
FIG. 1C is a plan view of the magnetic memory element shown in FIG. 1A.
Figure 2A:
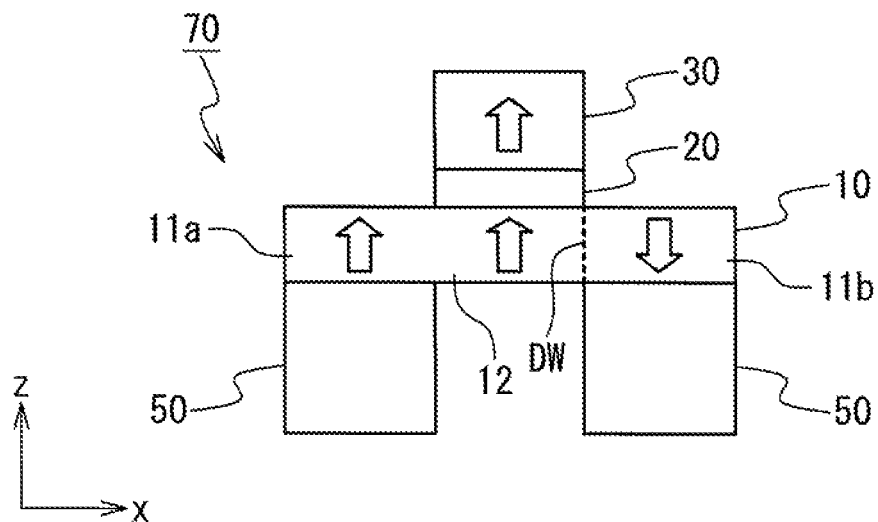
FIG. 2A shows the "0" state of the magnetic memory element.
Figure 2B:
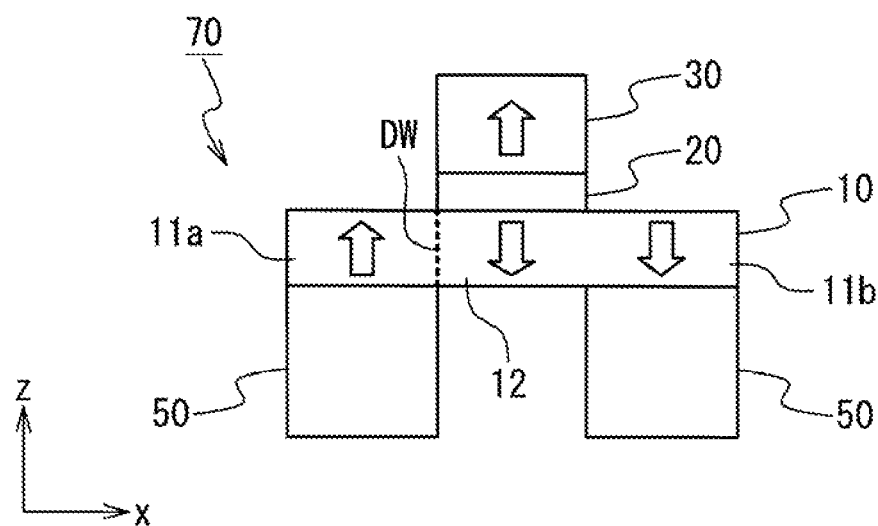
FIG. 2B shows the "1" state of the magnetic memory element.

FIGS. 2A and 2B show two magnetization states that the magnetic memory element 70 shown in FIGS. 1A to 1C can take. Here, let us consider a case where the magnetization directions of the magnetization fixed regions 11a and 11b of the first magnetization free layer 10 are respectively fixed in the +z-direction and the −z-direction, and the magnetization direction of the first magnetization fixed layer 30 is fixed in the +z-direction.

In FIG. 2A, the magnetization direction of the magnetization free region 12 of the first magnetization free layer 10 is the +z-direction. In this case, a domain wall DW is formed at a boundary between the magnetization free region 12 and the second magnetization free region 11b. Also, the magnetization direction of the magnetization free region 12 and the magnetization direction of the first magnetization fixed layer 30 are parallel to each other. Therefore, an MTJ resistance value becomes relatively small. Such a magnetization state is related to, for example, a data "0" magnetization state.

On the other hand, in FIG. 2B, the magnetization direction of the magnetization free region 12 of the first magnetization free layer 10 is the −z-direction. In this case, the domain wall DW is formed at a boundary between the magnetization free region 12 and the first magnetization free region 11a. Also, the magnetization direction of the magnetization free region 12 and the magnetization direction of the first magnetization fixed layer 30 are anti-parallel to each other. Therefore, the MTJ resistance value becomes relatively large. Such a magnetization state is related to, for example, a data "1" magnetization state.

In this manner, the two magnetization states can be achieved depending on the magnetization state of the first magnetization free layer 10, namely, the position of the domain wall in the first magnetization free layer 10. It should be noted that a correspondence relationship between the magnetization states defined in FIGS. 2A and 2B and the two magnetization states is arbitrary.

1-3. Data Write/Read Method

Next, a method of data write to the magnetic memory element 70 will be described with reference to FIGS. 3A and 3B. For simplicity, the first nonmagnetic layer 20 and the first magnetization fixed layer 30 are omitted in FIGS. 3A and 3B. According to the present exemplary embodiment, the data write to the magnetic memory element 70 is performed by the current driven domain wall motion method. For this purpose, the above-described electrode layers 50 (current introduction structure) connected to the first magnetization free layer 10 having the domain wall DW are used. By using the two electrode layers 50, it is possible to supply the write current in an in-plane direction in the first magnetization free layer 10 and thus to move the domain wall DW in a direction depending on the current direction. That is, the magnetization state of the first magnetization free layer 10 can be switched between the two magnetization states shown in FIGS. 2A and 2B, by the current driven domain wall motion.

Figure 3A:
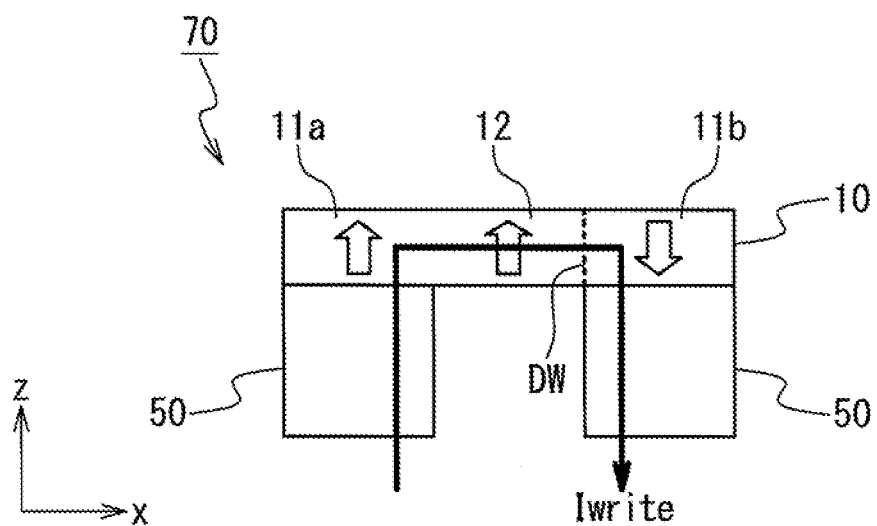
FIG. 3A is a conceptual diagram showing a method of data write to the magnetic memory element.

FIG. 3A shows a write current Iwrite in a case of the state switching from FIG. 2A ("0" state) to FIG. 2B ("1" state). As shown in FIG. 3A, the write current Iwrite is supplied from the first magnetization fixed region 11a through the magnetization free region 12 to the second magnetization fixed region 11b in the first magnetization free layer 10. Therefore, conduction electrons flow from the second magnetization fixed region 11b through the magnetization free region 12 to the first magnetization fixed region 11a. At this time, the spin transfer torque (Spin Transfer Torque; STT) acts on the domain wall DW that is located in the vicinity of the boundary between the second magnetization fixed region 11b and the magnetization free region 12, and thereby the domain wall DW moves towards the first magnetization fixed region 11a. That is to say, the current driven domain wall motion is caused. Since the write current Iwrite is decreased on the first magnetization fixed region 11a side of the boundary between the first magnetization fixed region 11a and the magnetization free region 12, the motion of the domain wall DW stops at in the vicinity of the boundary. In this manner, the magnetization state shown in FIG. 2B, namely, the data "1" write can be achieved.

Figure 3B:
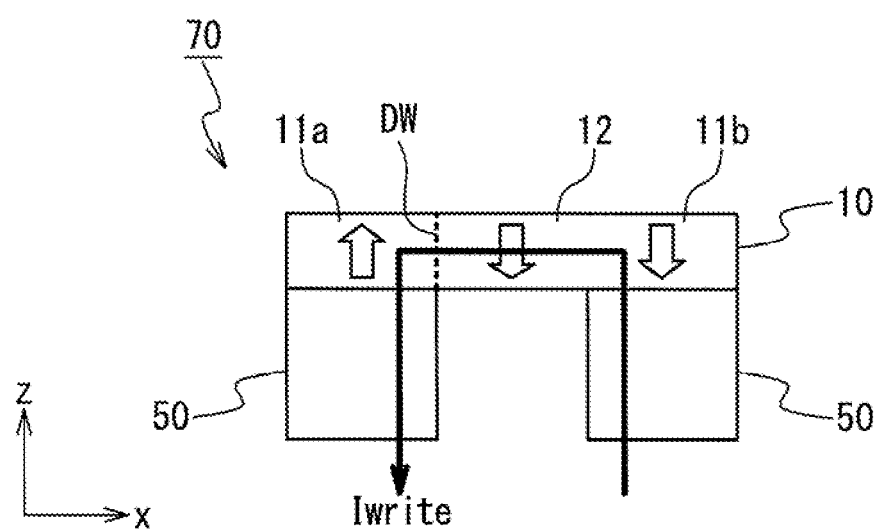
FIG. 3B is a conceptual diagram showing a method of data write to the magnetic memory element.

FIG. 3B shows a write current Iwrite in a case of the state switching from FIG. 2B ("1" state) to FIG. 2A ("0" state). As shown in FIG. 3B, the write current Iwrite is supplied from the second magnetization fixed region 11b through the magnetization free region 12 to the first magnetization fixed region 11a in the first magnetization free layer 10. Therefore, conduction electrons flow from the first magnetization fixed region 11a through the magnetization free region 12 to the second magnetization fixed region 11b. At this time, the spin transfer torque acts on the domain wall DW that is located in the vicinity of the boundary between the first magnetization fixed region 11a and the magnetization free region 12, and thereby the domain wall DW moves towards the second magnetization fixed region 11b. That is to say, the current driven domain wall motion is caused. Since the write current Iwrite is decreased on the second magnetization fixed region 11b side of the boundary between the second magnetization fixed region 11b and the magnetization free region 12, the motion of the domain wall DW stops at in the vicinity of the boundary. In this manner, the magnetization state shown in FIG. 2A, namely, the data "0" write can be achieved.

It should be noted that no state transition occurs when the data "0" write is performed with respect to the data "0" state or the data "1" write is performed with respect to the data "1" state. That is, overwrite is possible.

Next, a method of data read from the magnetic memory element 70 will be described with reference to FIGS. 4A and 4B. According to the present exemplary embodiment, the data read is performed by utilizing the tunneling magnetoresistive effect (Tunneling Magnetoresistive effect; TMR effect). For this purpose, a read current Iread is supplied in a direction penetrating through the MTJ (first magnetization free layer 10, first nonmagnetic layer 20 and first magnetization fixed layer 30). It should be noted that a direction of the read current Iread is arbitrary.

Figure 4A:
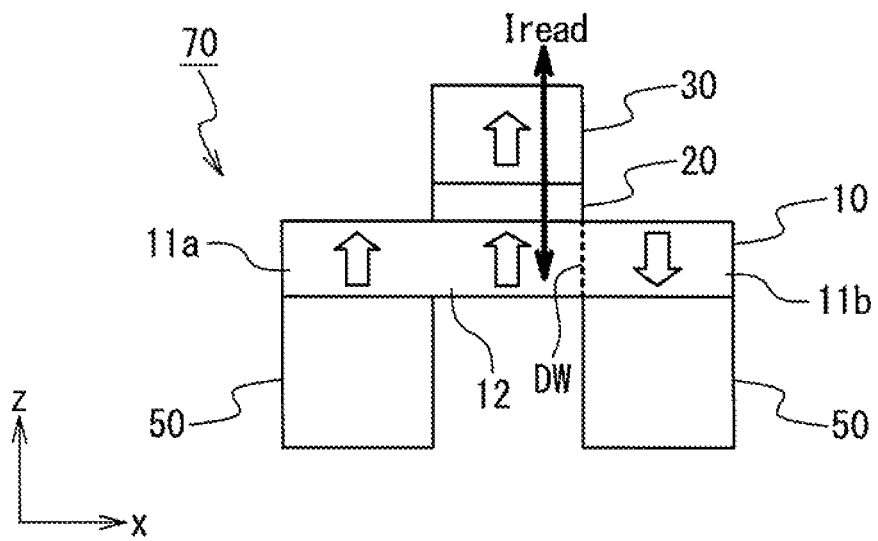
FIG. 4A is a conceptual diagram showing a method of data read from the magnetic memory element.
Figure 4B:
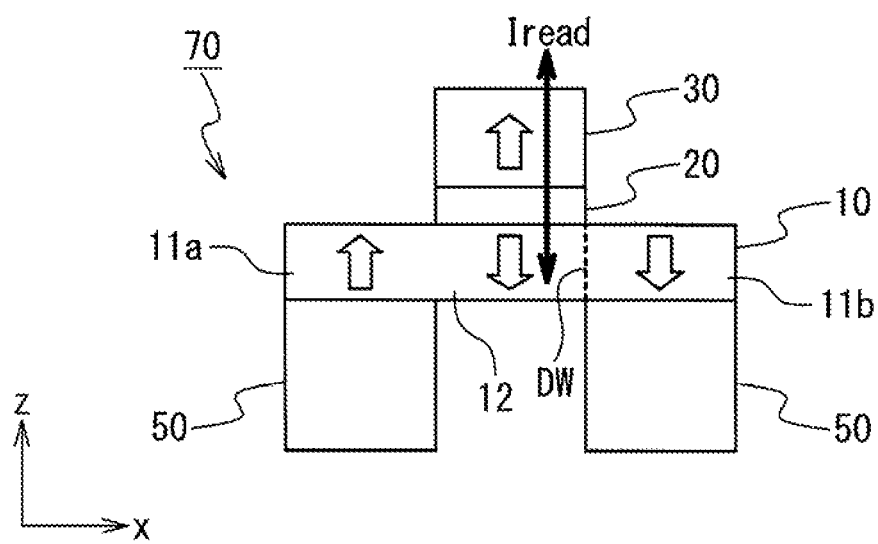
FIG. 4B is a conceptual diagram showing a method of data read from the magnetic memory element.

FIG. 4A shows the read current Iread in the case of the "0" state shown in FIG. 2A. In this case, the MTJ resistance value is relatively small because the magnetization direction of the magnetization free region 12 and the magnetization direction of the first magnetization fixed layer 30 are parallel to each other. On the other hand, FIG. 4B shows the read current Iread in the case of the "1" state shown in FIG. 2B. In this case, the MTJ resistance value is relatively large because the magnetization direction of the magnetization free region 12 and the magnetization direction of the first magnetization fixed layer 30 are anti-parallel to each other.

Therefore, a magnitude of the MTJ resistance value can be determined based on a magnitude of the read current Iread or a voltage value depending on the read current Iread. That is, it is possible to detect the magnetization state of the first magnetization free layer 10 (data storage layer) and to read the data stored as the magnetization state. In this manner, the first nonmagnetic layer 20 and the first magnetization fixed layer 30 function as the "read structure" for detecting the magnetization state of the first magnetization free layer 10 based on the tunneling magnetoresistive effect.

1-4. Magnetic Memory Cell and Magnetic Memory

Next, circuit configurations of the magnetic memory cell having the above-described magnetic memory element 70 and the magnetic memory having the magnetic memory cell will be described.

Figure 5:
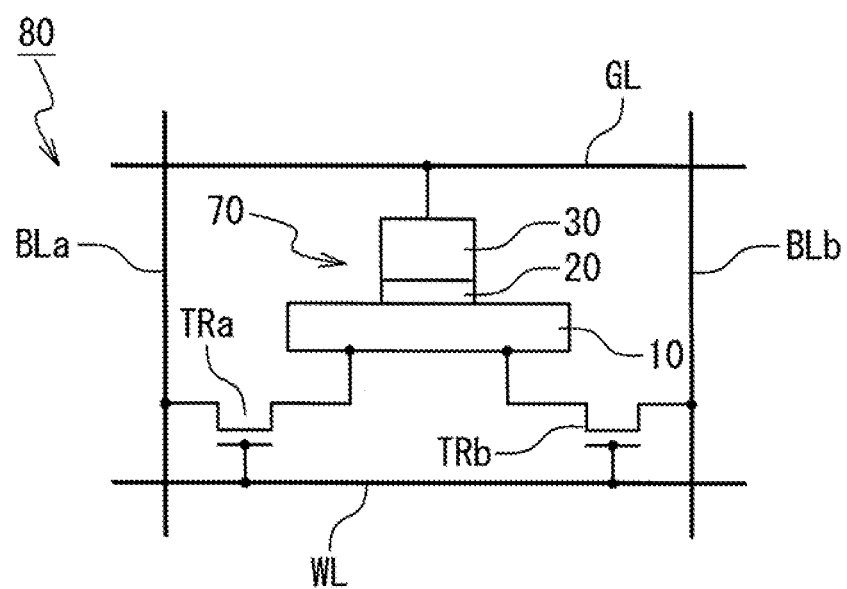
FIG. 5 is a circuit diagram showing a configuration of one magnetic memory cell.

FIG. 5 shows an example of a circuit configuration of one-bit magnetic memory cell 80. The magnetic memory cell 80 has a 2T-1MTJ (two transistors-one magnetic tunnel junction) configuration including the magnetic memory element 70 and two transistors TRa and TRb. The magnetic memory element 70 is a three-terminal element and is connected to a word line WL, a ground line GL and a bit line pair BLa, BLb. For example, a terminal connected to the first magnetization fixed layer 30 is connected to the ground line GL. A terminal connected to the first magnetization fixed region 11a of the first magnetization free layer 10 is connected to the bit line BLa through the transistor TRa. A terminal connected to the second magnetization fixed region 11b of the first magnetization free layer 10 is connected to the bit line BLb through the transistor TRb. Gates of the transistors TRa and TRb are connected to the common word line WL.

At the time of data write, the word line WL is set to the High level and thus the transistors TRa and TRb are turned ON. Moreover, any one of the bit line pair BLa and BLb is set to the High level and the other is set to the Low level (ground level). As a result, the write current Iwrite flows between the bit line BLa and the bit line BLb through the transistors TRa, TRb and the first magnetization free layer 10.

At the time of data read, the word line WL is set to the High level and thus the transistors TRa and TRb are turned ON. Moreover, the bit line BLa is set to the Open state and the bit line BLb is set to the High level. As a result, the read current Iread flows from the bit line BLb to the ground line GL penetrating through the MTJ of the magnetic memory element 70.

Figure 6:
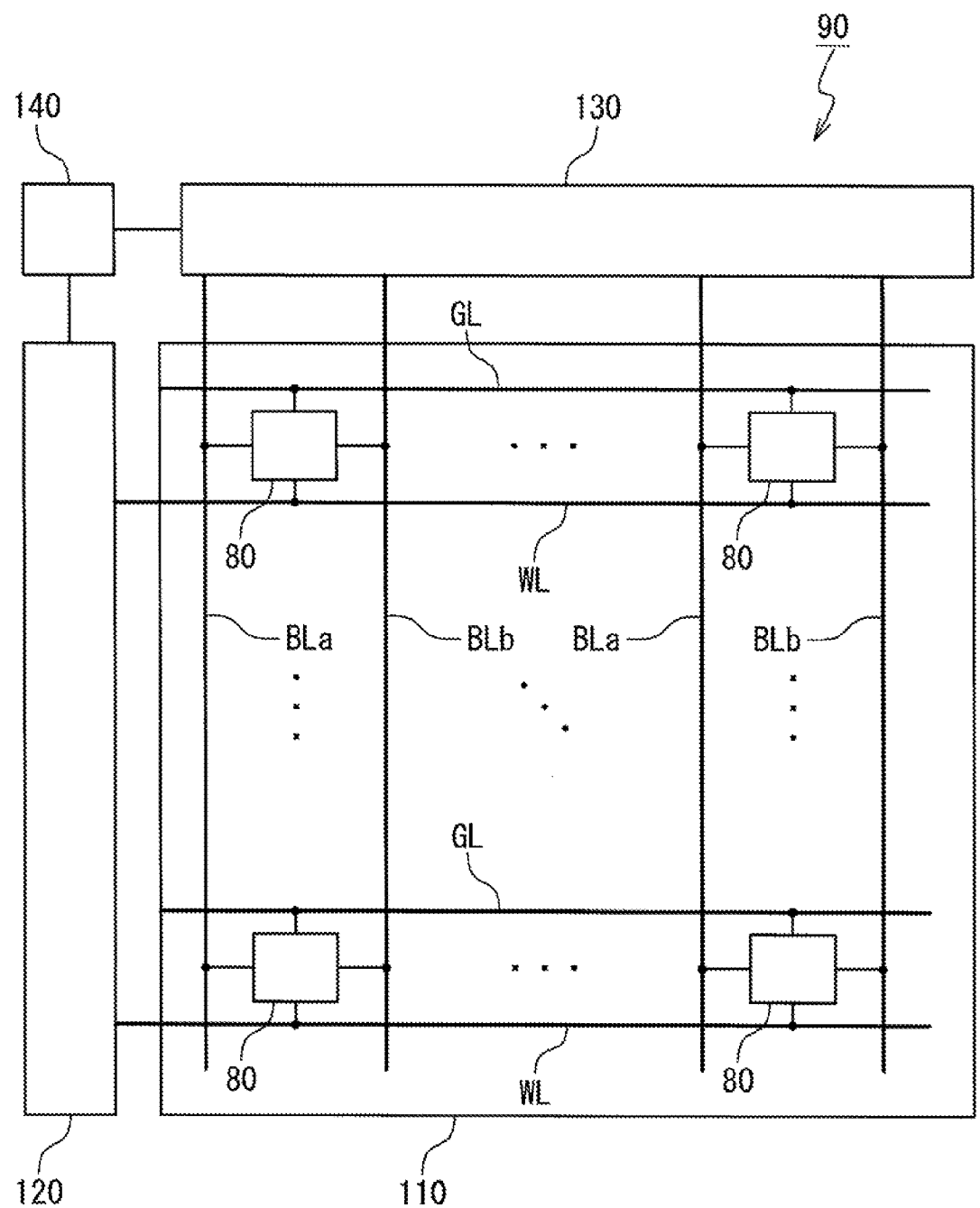
FIG. 6 is a circuit block diagram showing a configuration of an MRAM.

FIG. 6 is a block diagram showing a configuration example of a magnetic memory (MRAM) 90 according to the present exemplary embodiment. The magnetic memory 90 has a memory cell array 110, an X driver 120, a Y driver 130 and a controller 140. The memory cell array 110 is comprised of a plurality of magnetic memory cells 80 that are arranged in an array form. Each magnetic memory cell 80 is connected to the word line WL, the ground line GL and the bit line pair BLa and BLb, as also shown in the foregoing FIG. 5. The X driver 120 is connected to a plurality of word lines WL and drives a selected word line connected to an access-target magnetic memory cell 80 among the plurality of word lines WL. The Y driver 130 is connected to a plurality of bit line pairs BLa, BLb and sets each bit line to the state necessary for the data write or the data read. The controller 140 controls the respective X driver 120 and Y driver 130 in accordance with the data write or the data read.

2. FILM CONFIGURATION AND MATERIAL OF MAGNETIC MEMORY ELEMENT 70

The present invention can be applied to the magnetic memory element 70 of the current driven domain wall motion type as described above. The magnetic memory element 70 is provided with the data storage layer (first magnetization free layer 10) having the perpendicular magnetic anisotropy. According to the above-mentioned Non Patent Literature 3, the write current required for the current driven domain wall motion can be reduced by using the data storage layer having the perpendicular magnetic anisotropy.

Here, the inventors of the present patent application have recognized the following points. In order to actually achieve the current driven domain wall motion and to further reduce the write current, it is necessary to appropriately adjust a material of the first magnetization free layer 10. More specifically, it is desirable to use a material having small saturation magnetization and large spin polarizability. Furthermore, the perpendicular magnetization must be achieved by using such the material. In other words, it is necessary to achieve crystal orientation such that the perpendicular magnetization can be obtained in the first magnetization free layer 10. To this end, it is desirable to provide an "underlayer" on which the first magnetization free layer 10 can grow with a preferable crystal orientation.

Preferable film configuration and material for the magnetic memory element 70 according to the present exemplary embodiment will be described hereinafter. In particular, preferable configuration and material with regard to the first magnetization free layer 10 and the "underlayer" used for forming the first magnetization free layer 10 will be described.

2-1. First Magnetization Free Layer 10

As described above, it is required to achieve the current driven domain wall motion in the first magnetization free layer 10. According to Non Patent Literature 4 (A. Thiaville et al., Domain wall motion by spin-polarized current: a micromagnetic study, JOURNAL OF APPLIED PHYSICS, VOL. 95, NO. 11, pp. 7049-7051, 2004.), the current driven domain wall motion is more likely to occur as a parameter $g\mu_B P/2 eMs$ becomes larger. Here, the g is Lande g-factor, the $\mu_B$ is Bohr magneton, the P is spin polarizability, the e is elementary charge, and the Ms is saturation magnetization. Since g, $\mu_B$ and e are physical constants, it is effective for reducing the write current to make the spin polarizability P of the first magnetization free layer 10 large and to make the saturation magnetization Ms thereof small.

In terms of the saturation magnetization, an alternately laminated film of transition metal system such as Co/Ni, Co/Pt, Co/Pd, CoFe/Ni, CoFe/Pt, CoFe/Pd and the like is promising as the first magnetization free layer 10. It is known that the saturation magnetization of these materials is relatively small. To generalize such a transition metal system laminated film, the first magnetization free layer 10 has a laminated structure having a first layer and a second layer that are laminated. The first layer includes any of Fe, Co and Ni or alloy consisting of a plurality of materials selected from Fe, Co and Ni. The second layer includes any of Pt, Pd, Au, Ag, Ni and Cu or alloy consisting of a plurality of materials selected from Pt, Pd, Au, Ag, Ni and Cu.

In particular, Co/Ni among the above-described laminated films has the high spin polarizability. Therefore, it can be said that a Co/Ni laminated film is particularly preferable as the first magnetization free layer 10. Actually, the inventors of the present patent application experimentally confirmed that the domain wall motion with a high controllability can be achieved by using Co/Ni.

By the way, the magnetic material of the first magnetization free layer 10 as mentioned above has an fcc(111) orientation crystal structure that has an fcc structure and whose (111) surface is laminated in the substrate-perpendicular direction. Also, according to Non Patent Literature 5 (G. H. O. Daalderop et al., Prediction and Confirmation of Perpendicular Magnetic Anisotropy in Co/Ni Multilayers, PHYSICAL REVIEW LETTERS, VOL. 68, NO. 5, pp. 682-685, 1992), the perpendicular magnetic anisotropy of the laminated film as mentioned above occurs due to interface magnetic anisotropy at an interface between the films. Therefore, in order to achieve excellent perpendicular magnetic anisotropy in the first magnetization free layer 10, it is desirable to provide an "underlayer" on which the above-mentioned magnetic material can grow with an excellent fcc(111) orientation.

According to the present exemplary embodiment, an "underlayer" on which the first magnetization free layer 10 can grow with an excellent fcc(111) orientation to achieve excellent perpendicular magnetic anisotropy is provided. Hereinafter, the "underlayer" will be mainly described in detail.

2-2. Underlayer 15

Figure 7:
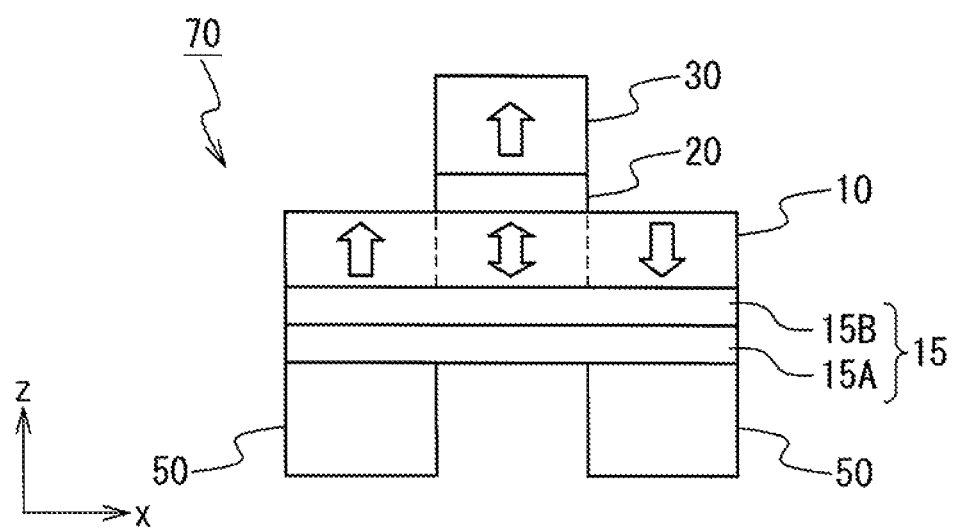
FIG. 7 is a side view showing a configuration of a magnetic memory element according to an exemplary embodiment of the present invention.

FIG. 7 is a side view showing a configuration of the magnetic memory element 70 to which an underlayer 15 according to the present exemplary embodiment is applied. The underlayer 15 is provided on the substrate side of the first magnetization free layer 10. Then, the first magnetization free layer 10 is formed on the underlayer 15 by using the underlayer 15 as a base.

The inventors of the present patent application have considered preferable structure and material of the underlayer 15. As an example, the inventors of the present patent application have focused on the Co/Ni laminated film having small saturation magnetization and high spin polarizability and considered a structure and material of the underlayer 15 that are preferable for the Co/Ni laminated film. As a result, it has been found that preferable characteristics can be obtained with regard to the Co/Ni laminated film when the underlayer 15 has a laminated structure of a first underlayer 15A and a second underlayer 15B as shown in FIG. 7.

It should be noted that the first underlayer 15A, the second underlayer 15B and the first magnetization free layer 10 are laminated in this order from the substrate side. That is, the first underlayer 15A is first formed. Next, the second underlayer 15B is formed on the first underlayer 15A by using the first underlayer 15A as a base. That is, the second underlayer 15B is so formed on the first underlayer 15A as to be in contact with the first underlayer 15A. Subsequently, the first magnetization free layer 10 having the perpendicular magnetic anisotropy is formed on the second underlayer 15B by using the second underlayer 15B as a base. That is, the first magnetization free layer 10 is so formed on the second underlayer 15B as to be in contact with the second underlayer 15B.

The first underlayer 15A includes a fourth to sixth group element. That is, the first underlayer 15A includes any of the fourth to sixth group metals such as Ti, Zr, Nb, Mo, Hf, Ta and W or alloy consisting of a plurality of materials selected from Ti, Zr, Nb, Mo, Hf, Ta and W. Whereas, the second underlayer 15B includes a ninth to eleventh group element. That is, the second underlayer 15B includes any of the ninth to eleventh group metals having the fcc structure such as Cu, Rh, Pd, Ag, Ir, Pt and Au or alloy consisting of a plurality of materials selected from Cu, Rh, Pd, Ag, Ir, Pt and Au. It should be noted that the first underlayer 15A and the second underlayer 15B are not necessarily made of a single metal of the above-exemplified material and can be made of alloy of them. Moreover, the present invention is applicable even if another material within an appropriate range is included. Also it is possible by adding appropriate materials to adjust such that more desirable characteristics can be obtained.

The reason why such a combination of the first underlayer 15A and the second underlayer 15B is preferable is as follows. Firstly, the fourth to sixth group metal used as the first underlayer 15A grows in an amorphous form and its surface energy becomes high, when its film thickness is small. Therefore, the first underlayer 15A is capable of generating a most dense surface (minimum surface energy surface) orientation of crystal growing thereon. That is, when the ninth to eleventh group metal having the fcc structure grows as the second underlayer 15B on the first underlayer 15A, the (111) surface orientation being the most dense surface orientation can be achieved. The second underlayer 15B serves as a template of the crystal orientation of the first magnetization free layer 10. As a result, an excellent fcc(111) orientation can be achieved also in the first magnetization free layer 10.

FIGS. 8A and 8B show magnetization curves of the Co/Ni laminated film that are measured with respect to various underlayer configurations. FIG. 8A shows the magnetization curves in the substrate-perpendicular direction, and FIG. 8B shows the magnetization curves in the substrate-parallel direction. An Si substrate attached with an oxide film is used as a substrate. Respective film thicknesses of Co and Ni are 0.3 nm and 0.6 nm, and the number of laminating times is four. As the underlayer configurations, four cases: Ta (5 nm), Pt (2 nm), Ta (5 nm)/Pt (2 nm) and no underlayer are investigated. As is clearly seen from FIGS. 8A and 8B, the perpendicular magnetization is achieved only when the underlayer is Ta (5 nm)/Pt (2 nm). This represents the effectiveness of the above-described laminated structure of the first underlayer 15A and the second underlayer 15B.

It should be noted that the film thicknesses of Co and Ni are arbitrary, although they are 0.3 nm and 0.6 nm, respectively, in the above example. More specifically, it has been confirmed that the laminated structure of the underlayer 15 according to the present exemplary embodiment is effective when the Co film thickness is not less than 0.15 nm and not more than 0.5 nm and the Ni film thickness is not less than the Co film thickness and not more than six times the Co film thickness.

Non Patent Literature 6 (F. J. A. den Broeder et al., Perpendicular Magnetic Anisotropy and Coercivity of Co/Ni Multilayers, IEEE TRANSACTIONS ON MAGNETICS, VOL. 28, NO. 5, pp. 2760-2765, 1992.) describes that the perpendicular magnetization can be obtained in the Co/Ni laminated film by using a single underlayer. More specifically, the first underlayer 15A as in the present exemplary embodiment is not provided, and only an underlayer of Au or Cu is used. However, it is necessary to make a film thickness of the underlayer very large as much as 10 nm or more. That is, even if the first underlayer 15A is not provided, the perpendicular magnetization may be achieved in the Co/Ni laminated film if the second underlayer 15B is sufficiently thick. However, as an underlayer becomes thicker, a resistance value of the underlayer becomes smaller and thus the write current is more likely to flow through the underlayer. In other words, a comparatively large part of the write current flows not in the first magnetization free layer 10 but in the underlayer, which causes increase in a total amount of write current including the part that does not contribute to the current driven domain wall motion. This is not preferable in terms of reduction in the write current.

As described above, in the case where the underlayer 15 has the laminated structure of the first underlayer 15A (fourth to sixth group element) and the second underlayer 15B (ninth to eleventh group element), an excellent perpendicular magnetization can be achieved in Co/Ni that grows on the underlayer 15. In particular, it has been experimentally confirmed that a particularly excellent perpendicular magnetization can be obtained when the underlayer 15 has the laminated structure of Ta (5 nm)/Pt (2 nm). Next, "film thickness ranges" of the first underlayer 15A and the second underlayer 15B with which such an excellent perpendicular magnetization can be achieved will be considered below.

2-3. Lower Limits of Film Thicknesses of First Underlayer 15A and Second Underlayer 15B The lower limit of film thickness is determined from the following point of view. The point of view is that the crystal orientation of the first magnetization free layer 10 does not become the fcc(111) orientation if the first underlayer 15A and the second underlayer 15B are not thick to some extent. The lower limits of film thicknesses of the first underlayer 15A and the second underlayer 15B are determined such that an excellent fcc(111) orientation is achieved in the first magnetization free layer 10.

The inventors of the present patent application have measured the magnetization curve of the Co/Ni laminated film with using the above-mentioned Ta (5 nm)/Pt (2 nm) underlayer 15 as a standard and variously changing the film thickness of the Ta film being the first underlayer 15A or the Pt film being the second underlayer 15B. The other experimental conditions are the same as those in the case of the foregoing FIGS. 8A and 8B.

Figure 9A:
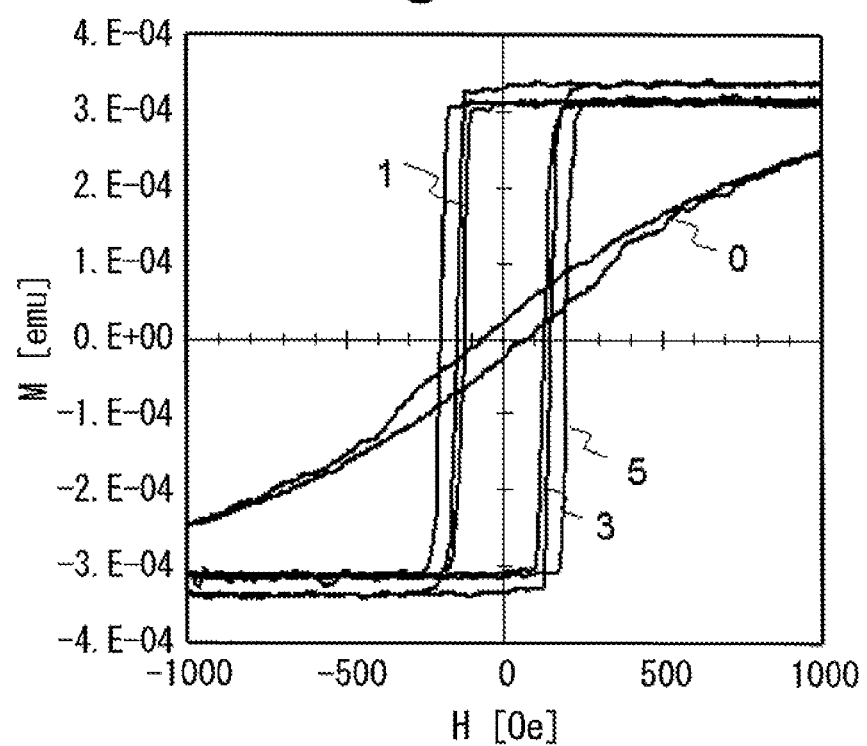
FIG. 9A is a graph showing a result of a measurement of Ta film thickness dependence of a magnetization curve.
Figure 9B:
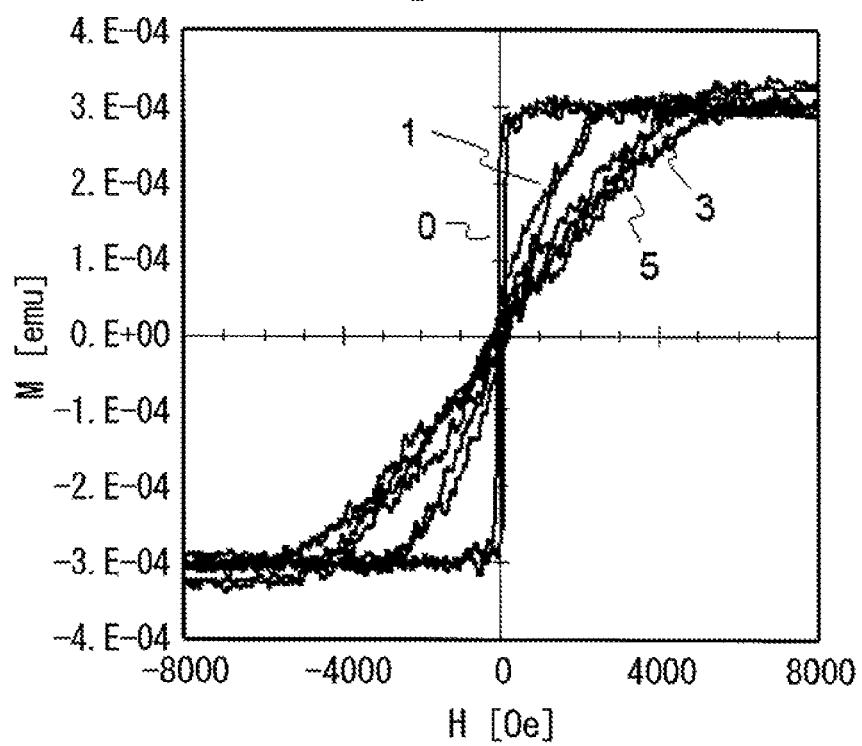
FIG. 9B is a graph showing a result of a measurement of Ta film thickness dependence of a magnetization curve.

First, let us consider the lower limit of film thickness of the Ta film being the first underlayer 15A. FIGS. 9A and 9B show magnetization curves of the Co/Ni laminated film that are measured with respect to various Ta film thicknesses. FIG. 9A shows the magnetization curves in the substrate-perpendicular direction, and FIG. 9B shows the magnetization curves in the substrate-parallel direction. The Ta film thickness is designed to be four kinds: 0 nm, 1 nm, 3 nm and 5 nm. As is clearly seen from the figures, an excellent perpendicular magnetization is achieved when the Ta film thickness is 3 nm or 5 nm. It can be seen from FIG. 9B that, when the Ta film thickness is 1 nm, the magnetization with which the magnetization curve is saturated is smaller than that in the cases of 3 nm and 5 nm and thus the perpendicular magnetic anisotropy is smaller than in those cases. However, as is clearly seen from FIG. 9A, an excellent perpendicular magnetization is achieved even when the Ta film thickness is 1 nm. Therefore, the lower limit of the Ta film thickness is about 1 nm. In a case where the fourth to sixth group element other than Ta is used, the equivalent effects as in the case of Ta can be obtained, and thus the lower limit value also is expected to be equivalent. Therefore, it can be said that the lower limit of film thickness of the first underlayer 15A is about 1 nm.

Figure 10A:
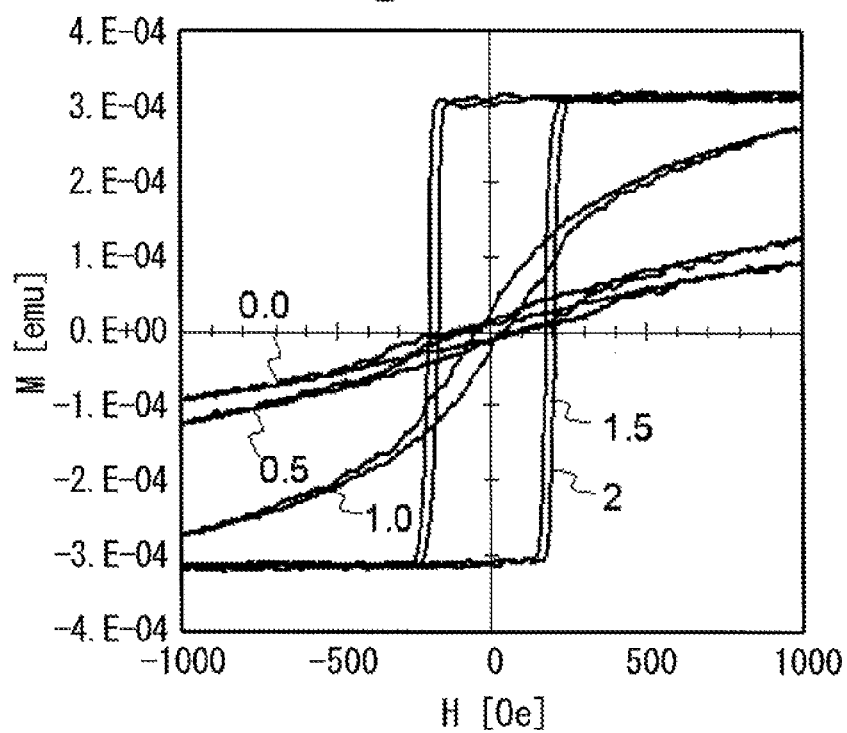
FIG. 10A is a graph showing a result of a measurement of Pt film thickness dependence of a magnetization curve.
Figure 10B:
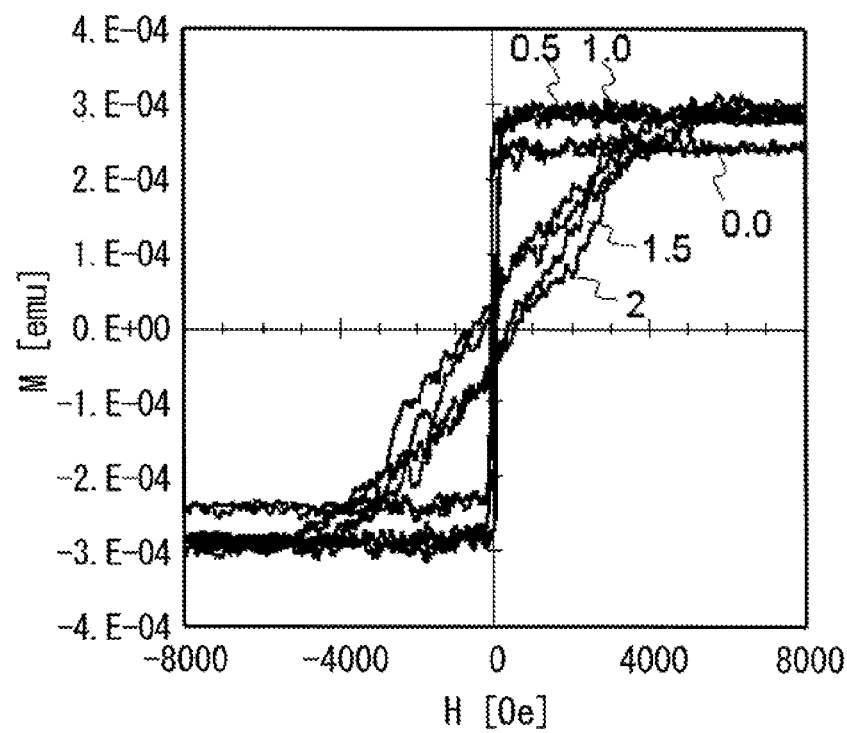
FIG. 10B is a graph showing a result of a measurement of Pt film thickness dependence of a magnetization curve.

Next, let us consider the lower limit of film thickness of the Pt film being the second underlayer 15B. FIGS. 10A and 10B show magnetization curves of the Co/Ni laminated film that are measured with respect to various Pt film thicknesses. FIG. 10A shows the magnetization curves in the substrate-perpendicular direction, and FIG. 10B shows the magnetization curves in the substrate-parallel direction. The Pt film thickness is designed to be five kinds: 0 nm, 0.5 nm, 1 nm, 1.5 nm and 2 nm. As is clearly seen from the figures, an excellent perpendicular magnetization is achieved when the Pt film thickness is 1.5 nm or more. Meanwhile, the perpendicular magnetization is not achieved when the Pt film thickness is 1 nm or less. As a result of detailed consideration, it has been revealed that an excellent perpendicular magnetization is achieved in the Co/Ni laminated film when the Pt film thickness is 1.1 nm or more. Therefore, the lower limit of the Pt film thickness is about 1.1 nm. It should be noted that this result is obtained also in a case where Pd is used as the material of the second underlayer 15B. In a case where the ninth to eleventh group element other than Pt and Pd is used, the equivalent effects can be obtained, and thus the lower limit value also is expected to be equivalent. Therefore, it can be said that the lower limit of film thickness of the second underlayer 15B is about 1.1 nm.

2-4. Upper Limits of Film Thicknesses of First Underlayer 15A and Second Underlayer 15B The upper limit of film thickness is determined from a viewpoint of a desirable magnitude of the write current. As described above, the underlayer 15 is adjacent to the first magnetization free layer 10. Therefore, the write current that should contribute to the current driven domain wall motion within the first magnetization free layer 10 is divided and flows also in the underlayer 15. The amount of write current flowing in the underlayer 15 depends on a ratio of a resistance value between the first magnetization free layer 10 and the underlayer 15. As the underlayer 15 becomes thicker, the resistance value of the underlayer 15 becomes relatively smaller and thus the write current is more likely to flow in the underlayer 15. In other words, a comparatively large part of the write current flows not in the first magnetization free layer 10 but in the underlayer 15, which causes increase in a total amount of write current including the part that does not contribute to the current driven domain wall motion. This is not preferable in terms of reduction in the write current. Therefore, the upper limit of film thickness of the underlayer 15 is determined such that the total amount of write current does not become too much.

According to the above-mentioned Non Patent Literature 1, an equivalent cell area to that of an existing embedded SRAM can be achieved by reducing the write current to 0.5 mA or less. In practice, one criterion of the desirable magnitude of the write current is "0.2 mA or less". The reason is that when the write current is reduced to about 0.2 mA, a minimum layout becomes possible in the 2T-1MTJ cell configuration proposed in the Non Patent Literature 1 and thus substitution for an existing volatile memory and low costs can be achieved.

According to the above-mentioned Non Patent Literature 2, a current density required for the current driven domain wall motion is about $1 \times 10^8$ [A/cm2]. For example, in a case where a width and a film thickness of the data storage layer are 100 nm and 10 nm, respectively, the write current of 1 mA is required. This does not achieve the above-mentioned preferable write current (=0.2 mA).

As described above, it is desirable in terms of application that the write current is reduced to 0.2 mA or less in the domain wall motion type MRAM. In the present exemplary embodiment, the upper limits of film thicknesses of the first underlayer 15A and the second underlayer 15B are determined such that the write current becomes 0.2 mA or less.

Figure 11:
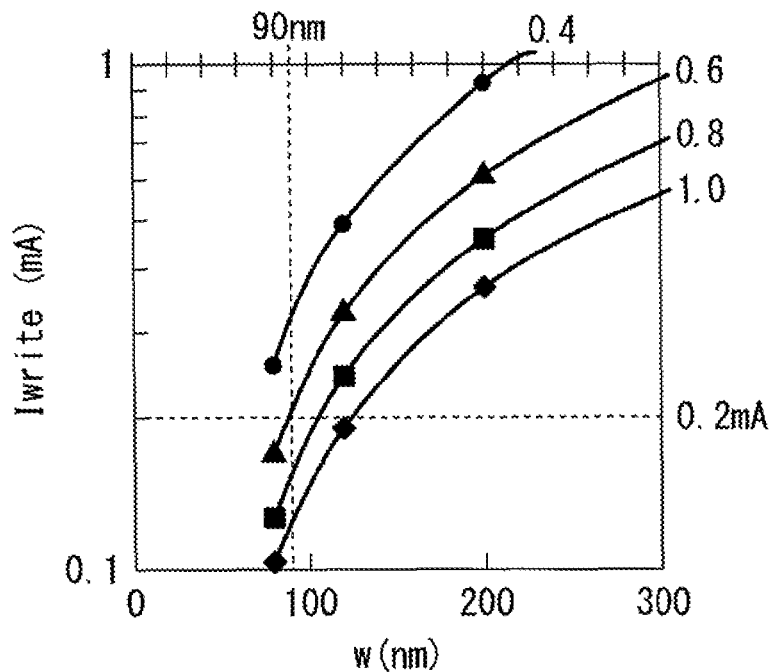
FIG. 11 is a graph showing a calculation result of current division ratio dependence of a write current.

FIG. 11 shows a calculation result of the write current in the case of the domain wall motion type MRAM using the perpendicular magnetic film, which is obtained by a micromagnetic simulation (refer to Non Patent Literature 7: S. Fukami et al., Intrinsic threshold current density of domain wall motion in nano-strips with perpendicular magnetic anisotropy for use in low-write-current MRAMs, INTERNATIONAL MAGNETIC CONFERENCE, TECHNICAL DIGEST, Paper No. HH-11, 2008). In FIG. 11, the vertical axis represents the write current Iwrite (mA), and the horizontal axis represents a width w (nm) of the first magnetization free layer 10. Moreover, in FIG. 11, the calculation result is shown with respect to various "current division ratios". Here, the current division ratio means a ratio of an amount of write current flowing in the first magnetization free layer 10 to the total amount of write current. In a case where the current division ratio is 1, whole of the write current flows in the first magnetization free layer 10. The first magnetization free layer 10 is the Co/Ni laminated film and its film thickness is set to 3 nm.

In FIG. 11, the total amount of write current (adjusted value) is shown with respect to each case where the current division ratio is 1.0, 0.8, 0.6 and 0.4. Here, let us consider a condition that the write current becomes 0.2 mA or less in the 90 nm generation (w=90 nm). It can be seen from FIG. 11 that the condition is satisfied when the current division ratio is 0.6 or more and the condition is not satisfied when the current division ratio is 0.4. Therefore, the upper limits of film thicknesses of the first underlayer 15A and the second underlayer 15B are determined under a condition that the current division ratio to the Co/Ni becomes 0.6 or more.

It should be noted that it has been revealed by the micromagnetic simulation that the thermal stability of the domain wall is enough in the case of the element structure assumed here (width w=90 nm, Co/Ni film thickness=3 nm). In a case where the width w is smaller than that, the write current less than 0.2 mA is possible even if the current division ratio is less than 0.6. In this case, however, the requirement of the thermal stability is not satisfied and therefore it becomes necessary to ensure the thermal stability by increasing the Co/Ni film thickness. Therefore, the write current is not reduced so much in practice. On the other hand, in a case where the width w is larger than that, the write current becomes 0.2 mA or more even if the current division ratio is 0.6. In this case, however, the thermal stability is excess and therefore it is possible to reduce the write current by reducing the Co/Ni film thickness. Because of this, the above-mentioned constraint of the current division ratio obtained in the case of the element structure. (width w=90 nm, Co/Ni film thickness=3 nm) is considered to be valid even if the element structure is slightly changed.

Next, let us consider the current division ratio of the write current for each layer of the laminated structure consisting of the first underlayer 15A (Ta film), the second underlayer 15B (Pt film) and the first magnetization free layer (Co/Ni laminated film). The current division ratios for the respective layers are calculated based on a result of a measurement of respective sheet resistances of the Ta film, the Pt film and the Co/Ni laminated film. A sum of the current division ratios for the respective layers is 1.

Figure 12:
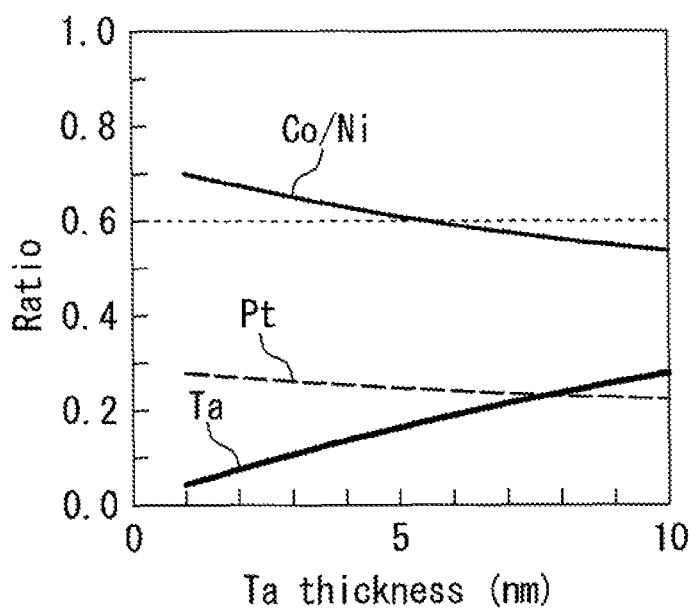
FIG. 12 is a graph showing a calculation result of Ta film thickness dependence of a current division ratio for each layer.

FIG. 12 shows a calculation result of Ta film thickness dependence of the current division ratio for each layer. The vertical axis represents the current division ratio, and the horizontal axis represents the Ta film thickness. Here, the Pt film thickness is fixed to 1.5 nm and the Co/Ni film thickness is fixed to 3 nm. Considering the above-mentioned condition that the current division ratio for the Co/Ni is 0.6 or more, it can be seen that the condition is satisfied when the Ta film thickness is 5 nm or less. Therefore, the upper limit of the Ta film thickness is 5 nm. In practice, even when the Ta film thickness is increased to about 10 nm, the condition can be satisfied by a method of increasing resistivity of the second underlayer 15B which will be described later. In a case of the fourth to sixth group element other than Ta, it basically falls within an equivalent range, although the upper limit of film thickness may vary slightly because the resistivity is different. Therefore, it can be said that the upper limit of film thickness of the first underlayer 15A is about 10 nm.

Figure 13:
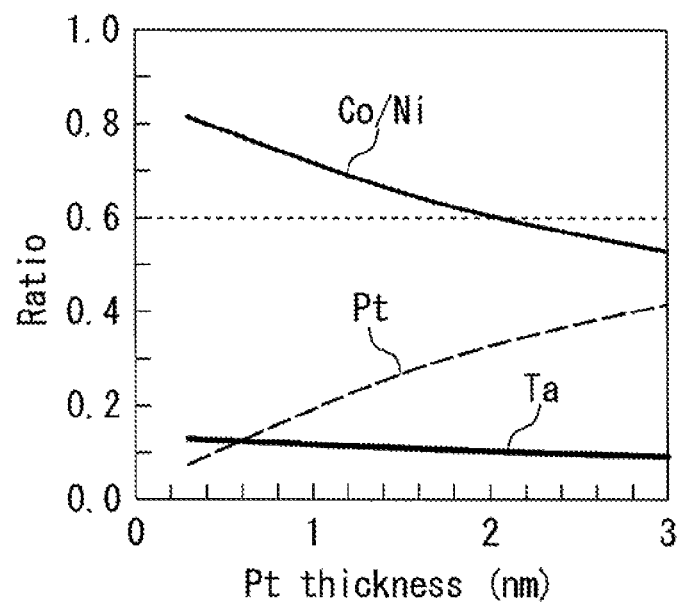
FIG. 13 is a graph showing a calculation result of Pt film thickness dependence of a current division ratio for each layer.

FIG. 13 shows a calculation result of Pt film thickness dependence of the current division ratio for each layer. The vertical axis represents the current division ratio, and the horizontal axis represents the Pt film thickness. Here, the Ta film thickness is fixed to 3 nm and the Co/Ni film thickness is fixed to 3 nm. Considering the above-mentioned condition that the current division ratio for the Co/Ni is 0.6 or more, it can be seen that the condition is satisfied when the Pt film thickness is 2 nm or less. Therefore, the upper limit of the Pt film thickness is 2 nm. In a case of the ninth to eleventh group element other than Pt, it basically falls within an equivalent range, although the upper limit of film thickness may vary slightly because the resistivity is different. It should be noted that although the resistivity of Pt is comparatively high among the ninth to eleventh group elements, the resistivity can be further increased to about 1.5 times higher by alloying for example. For example, the resistivity of alloy of Pt and Pd is higher than that in a case of pure Pt or pure Pd, which is preferable. By using such a method of increasing the resistivity, the above-mentioned condition can be satisfied even when the film thickness of the second underlayer 15B is increased to about 3 nm. Therefore, it can be said that the upper limit of film thickness of the second underlayer 15B is about 3 nm.

Figure 14:
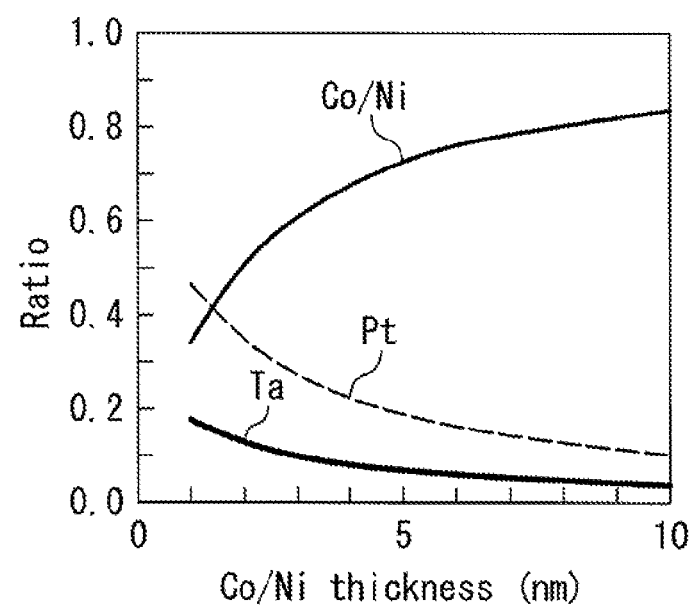
FIG. 14 is a graph showing a calculation result of Co/Ni film thickness dependence of a current division ratio for each layer.

FIG. 14 shows a calculation result of Co/Ni film thickness dependence of the current division ratio for each layer. As the Co/Ni film thickness becomes smaller, the resistance value of the Co/Ni film is relatively increased and thus the current division ratio for the Co/Ni becomes smaller. In this case, however, the write current itself becomes smaller (i.e. the curve shown in FIG. 11 moves downward) and thus the permissible lower limit of the current division ratio also becomes smaller. Also from this aspect, it can be said that the condition that "the current division ratio is 0.6 or more in the case where the width=90 nm and the film thickness=3 nm" is basically valid.

2-5. Supplement

In the above, the case where the material of the first magnetization free layer 10 is Co/Ni has been described as an example. The present invention is applicable even when the material of the first magnetization free layer 10 is another one (Co/Pd, Co/Pt, CoFe/Pt, CoFe/Pd etc.). Since the resistivity of such the material is roughly equivalent to that of Co/Ni, the above-described underlayer material and film thickness range can be applied similarly and thereby preferable characteristics can be obtained.

3. EFFECTS

According to the present exemplary embodiment, as described above, it is possible to preferably achieve the first magnetization free layer 10 (data storage layer) having the perpendicular magnetic anisotropy in the magnetic memory that utilizes the current driven domain wall motion. Therefore, the write current is reduced. In particular, the write current can be reduced to 0.2 mA or less by appropriately selecting the materials and the film thicknesses of the first magnetization free layer 10 and the underlayer 15. The magnetic memory in which the write current is reduced to 0.2 mA or less can be substitution for the existing memory.

4. MODIFICATION EXAMPLES

The magnetic memory element 70 to which the present invention can be applied is not limited to that shown in FIGS. 1A to 1C. The present invention can be applied also to the magnetic memory element 70 as described below.

4-1. First Modification Example

Figure 15A:
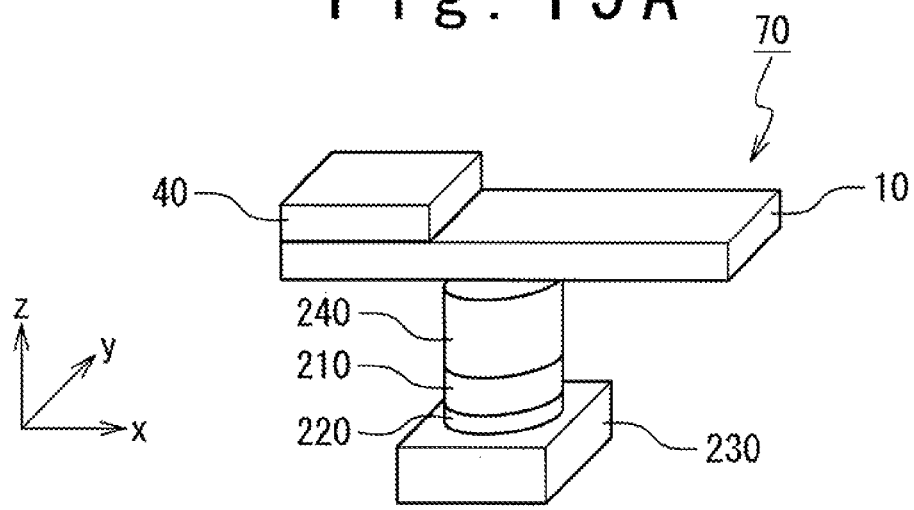
FIG. 15A is a perspective view showing a modification example of a magnetic memory element to which the present invention can be applied.
Figure 15B:
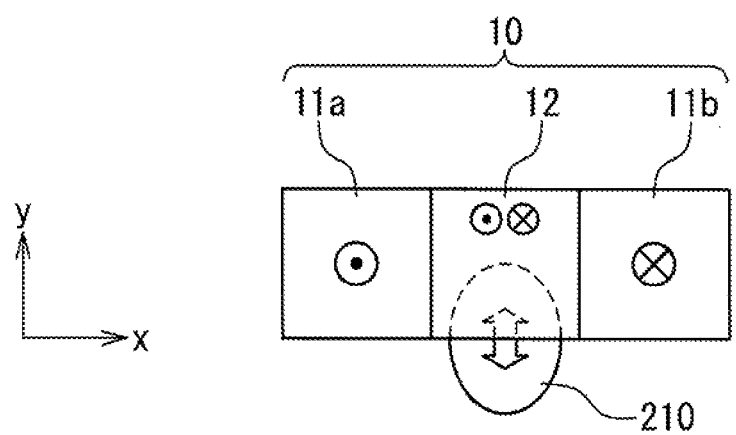
FIG. 15B is a plan view of the magnetic memory element shown in FIG. 15A.
Figure 15C:
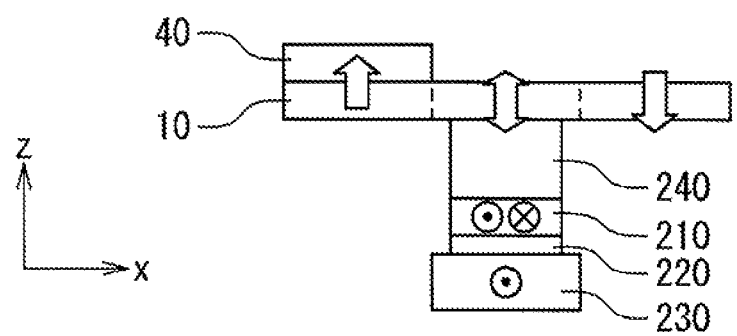
FIG. 15C is a side view of the magnetic memory element shown in FIG. 15A.

FIGS. 15A to 15C show a first modification example of the magnetic memory element 70. FIG. 15A is a perspective view, FIG. 15B is a plan view and FIG. 15C is a side view. The first modification example relates to the read structure for reading out the data stored in the first magnetization free layer 10 (data storage layer). More specifically, an MTJ comprised of a second magnetization free layer 210, a second nonmagnetic layer 220 and second magnetization fixed layer 230 is provided as the read structure, instead of the above-described first nonmagnetic layer 20 and first magnetization fixed layer 30.

More specifically, the second magnetization free layer 210 and the second magnetization fixed layer 230 are made of ferromagnetic materials having in-plane magnetic anisotropy. A magnetization direction of the second magnetization free layer 210 is variable, and a magnetization direction of the second magnetization fixed layer 230 is substantially fixed in one direction. Moreover, a direction of the magnetic anisotropy of the second magnetization free layer 210 is arbitrary as long as it is an in-plane direction. The second nonmagnetic layer 220 is made of a nonmagnetic material and is sandwiched between the second magnetization free layer 210 and the second magnetization fixed layer 230. The second magnetization free layer 210, the second nonmagnetic layer 220 and the second magnetization fixed layer 230 form one MTJ that is physically independent of the first magnetization free layer 10. The MTJ may be electrically connected to the first magnetization free layer 10 through a contact layer 240. It should be noted that the material of the second magnetization free layer 210 and the second magnetization fixed layer 230 is exemplified by Co—Fe—B, and the material of the second nonmagnetic layer 220 is exemplified by Mg—O. It is known that a very high MR ratio can be obtained by using such the materials.

The second magnetization free layer 210 of the MTJ is magnetically coupled to the magnetization free region 12 of the first magnetization free layer 10. That is, the magnetization state of the magnetization free region 12 affects a magnetization state of the second magnetization free layer 210. Moreover, as shown in FIG. 15B, center of the second magnetization free layer 210 is displaced from center of the magnetization free region 12 in the x-y plane. The displacement direction is hereinafter referred to as a "first direction". In the example shown in FIG. 15B, the first direction is the −y-direction. However, the first direction is arbitrary. The first direction may be +y-direction or may include the x component.

In the example shown in FIGS. 15A to 15C, the MTJ is placed below (−z-axis direction of) the first magnetization free layer 10. However, the position of the MTJ is arbitrary. The MTJ may be placed above the first magnetization free layer 10. What is important is that the second magnetization free layer 210 is magnetically coupled to the magnetization free region 12 and the center of the second magnetization free layer 210 is displaced in the first direction in the x-y plane from the center of the magnetization free region 12.

Figure 16A:
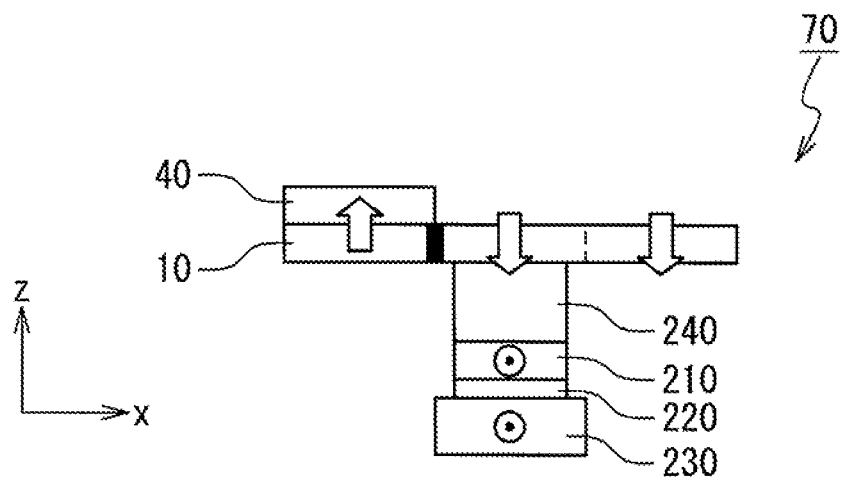
FIG. 16A is a conceptual diagram for explaining principle of the magnetic memory element shown in FIGS. 15A to 15C.
Figure 16B:
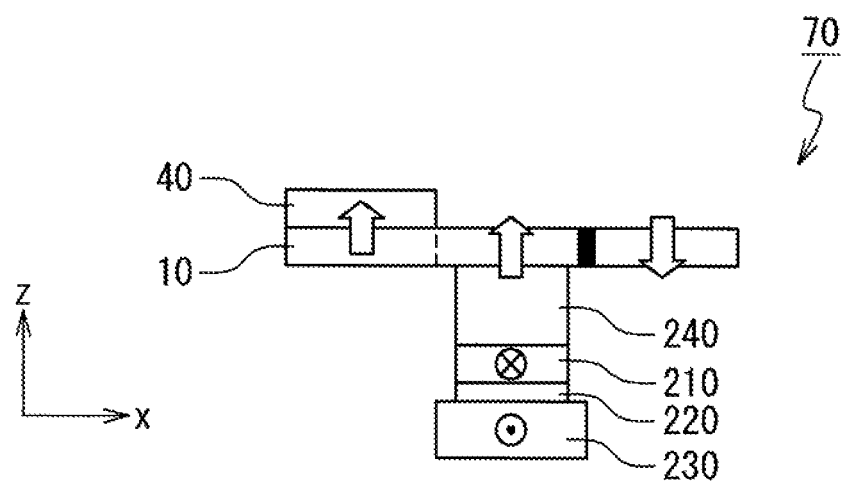
FIG. 16B is a conceptual diagram for explaining principle of the magnetic memory element shown in FIGS. 15A to 15C.

FIGS. 16A and 16B show two magnetization states that the magnetic memory element 70 shown in FIGS. 15A to 15C can take. Here, let us consider a case where the magnetization direction of the second magnetization fixed layer 230 is fixed in the −y-direction.

In FIG. 16A, the magnetization direction of the magnetization free region 12 of the first magnetization free layer 10 is the −z-direction. In this case, the magnetization direction of the second magnetization free layer 210 has the −y-direction component due to the magnetic coupling between the magnetization free region 12 and the second magnetization free layer 210. The reason is that the second magnetization free layer 210 is placed below the magnetization free region 12 and the center of the second magnetization free layer 210 is displaced in the −y-direction from the center of the magnetization free region 12. In this case, the MTJ resistance value becomes relatively small. This magnetization state is related to, for example, the data "0" magnetization state.

On the other hand, in FIG. 16B, the magnetization direction of the magnetization free region 12 of the first magnetization free layer 10 is the +z-direction. In this case, the magnetization direction of the second magnetization free layer 210 has the +y-direction component due to the magnetic coupling between the magnetization free region 12 and the second magnetization free layer 210. Therefore, the MTJ resistance value becomes relatively large. This magnetization state is related to, for example, the data "1" magnetization state.

In this manner, the perpendicular magnetization state of the first magnetization free layer 10 being the data storage layer is reflected in the in-plane magnetization state of the second magnetization free layer 210 through the magnetic coupling. When the magnetization direction of the magnetization free region 12 is switched by the data write, accordingly the magnetization direction of the second magnetization free layer 210 also is changed and thus the MTJ resistance value is changed. It is therefore possible to detect, based on the MTJ resistance value, the data stored in the first magnetization free layer 10. In this sense, the MTJ plays a role of the read structure.

It should be noted that although the magnetization fix direction of the second magnetization fixed layer 230 is not limited to the −y-direction and is arbitrary, it is preferably parallel to or anti-parallel to the above-mentioned first direction. The reason is that leakage magnetic flux from the magnetization free region 12 has a component parallel to or anti-parallel to the first direction at the position of the second magnetization free layer 210. This means that a magnetization variation component of the second magnetization free layer 210 affected by the leakage magnetic flux is parallel to or anti-parallel to the first direction. Therefore, a difference, in the MTJ resistance value between the two magnetization states becomes most conspicuous in the case where the magnetization fix direction of the second magnetization fixed layer 230 is parallel to or anti-parallel to the first direction.

According to the first modification example, as described above, the MTJ being the read structure is so provided as to be physically independent of the first magnetization free layer 10 being the data storage layer. It is therefore possible to design the read structure contributing to read characteristics and the data storage layer contributing to write characteristics independently of each other. For example, it is possible to design the MTJ by using the in-plane magnetic film such that a high MR ratio is obtained while design the first magnetization free layer 10 by using the perpendicular magnetic film such that the write current is reduced. The read characteristics and the write characteristics can be optimized independently of each other, which is preferable.

4-2. Second Modification Example

The first magnetization free layer 10 includes the first magnetization fixed region 11a and the second magnetization fixed region 11b whose magnetization directions are fixed to be anti-parallel to each other. In order to achieve such the anti-parallel magnetization fixation, a support magnetic layer 40 may be so provided as to be adjacent to the first magnetization fixed region 11a and/or the second magnetization fixed region 11b.

Figure 17A:
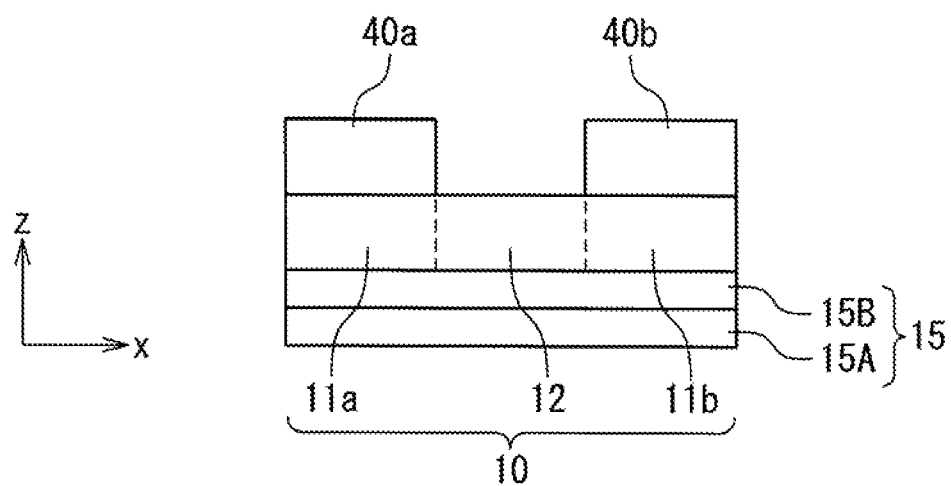
FIG. 17A is a side view showing another modification example of the magnetic memory element.
Figure 17B:
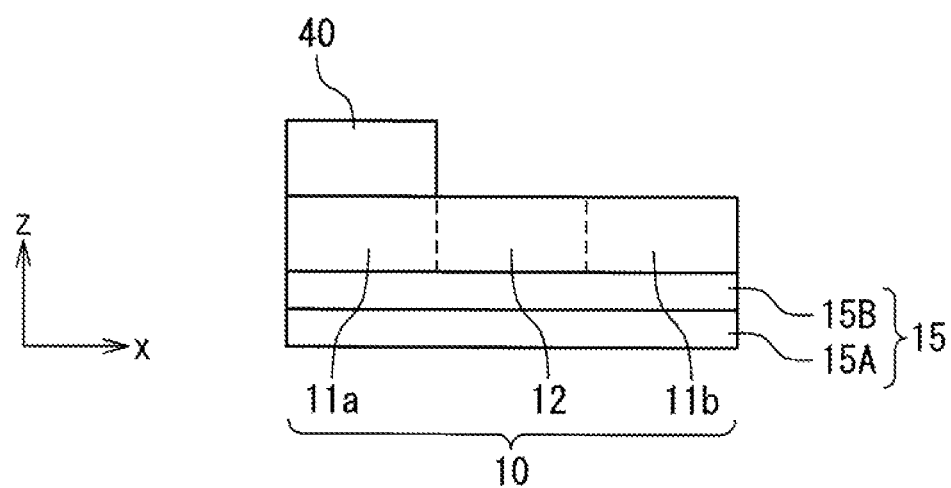
FIG. 17B is a side view showing still another modification example of the magnetic memory element.
Figure 17C:
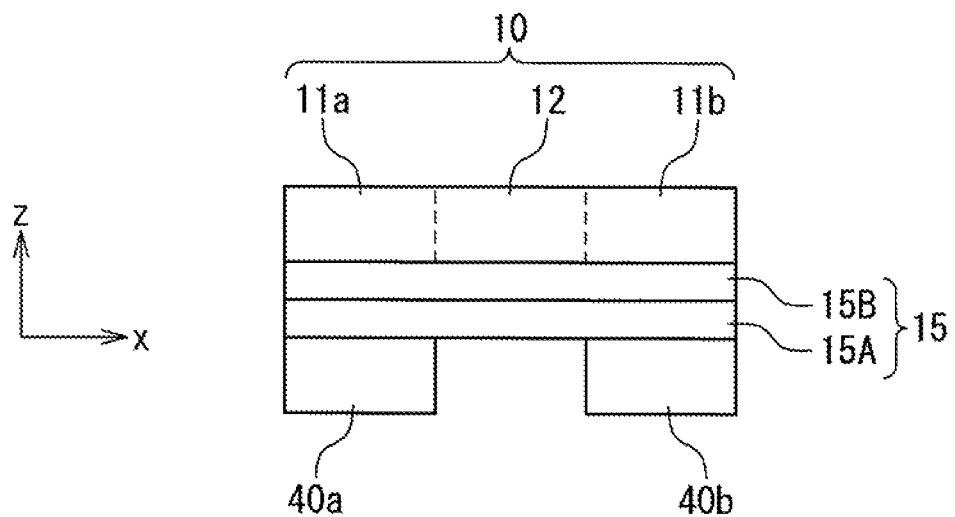
FIG. 17C is a side view showing still another modification example of the magnetic memory element.
Figure 17D:
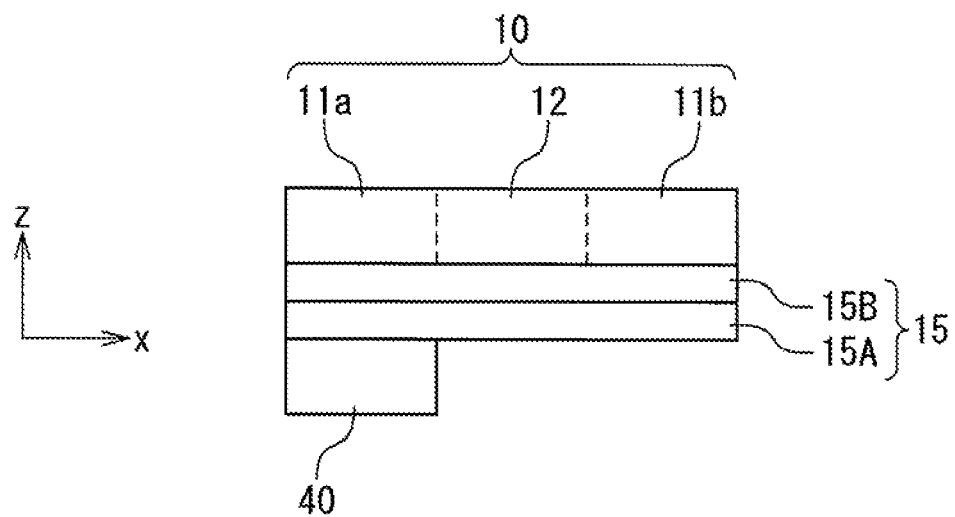
FIG. 17D is a side view showing still another modification example of the magnetic memory element.

For example, as shown in the foregoing FIGS. 15A to 15C, 16A and 16B, the support magnetic layer 40 is so provided as to be adjacent to the one first magnetization fixed region 11a. Alternatively, as shown in FIG. 17A and FIG. 17C, two support magnetic layers 40a and 40b may be respectively provided for the first magnetization fixed region 11a and the second magnetization fixed region 11b. In this case, materials of the two support magnetic layers 40a and 40b may be the same or may be different. As shown in FIGS. 17A and 17B, the support magnetic layer 40 may be provided above the first magnetization free layer 10. Alternatively, as shown in FIGS. 17C and 17D, the support magnetic layer 40 may be provided below the first magnetization free layer 10. In the cases of FIGS. 17C and 17D, the support magnetic layer 40, which is not directly in contact with the first magnetization free layer 10, can fix the magnetization direction of the magnetization fixed region 11 in a desired direction by magnetic coupling such as magnetostatic coupling.

4-3. Third Modification Example

A range of application of the present invention is not limited to the MRAM having the circuit configuration as shown in FIGS. 5 and 6. For example, the present invention can be applied to a racetrack memory that is proposed as a high-capacity memory device in Patent Literature 2 (U.S. Pat. No. 6,834,005). In the racetrack memory, memory regions are successively placed in a track form. On reading out a data stored in a desired bit, a current is introduced into the track to move the desired bit to a read-out region. In the read-out process, the current driven domain wall motion is utilized. It is therefore possible to reduce power consumption at a time of data read in the racetrack memory, by applying the film configuration according to the present invention.

The exemplary embodiments and the modification examples described above can be combined with each other as long as no contradiction arises.

While the exemplary embodiments of the present invention have been described above with reference to the attached drawings, the present invention is not limited to these exemplary embodiments and can be modified as appropriate by those skilled in the art without departing from the spirit and scope of the present invention.

This application is the National Phase of PCT/JP2009/064299, filed Aug. 13, 2009, which is based upon and claims the benefit of priority from Japanese patent application No. 2008-224585, filed on Sep. 2, 2008, the disclosure of which is incorporated herein in its entirely by reference.

The invention claimed is:

1. A magnetic memory comprising:
a first underlayer;
a second underlayer formed on said first underlayer so as to be in contact with said first underlayer; and
a data storage layer formed on said second underlayer so as to be in contact with said second underlayer,
wherein said data storage layer is a Co/Ni laminated film having perpendicular magnetic anisotropy and has an fcc(111) orientation crystal structure, and
a magnetization state of said data storage layer is changed by current driven domain wall motion.

2. The magnetic memory according to claim 1,
wherein said first underlayer includes a fourth to sixth group element, and
said second underlayer includes a ninth to eleventh group element.

3. The magnetic memory according to claim 2,
wherein a film thickness of said first underlayer is not less than 1 nm and not more than 10 nm.

4. The magnetic memory according to claim 2,
wherein a film thickness of said second underlayer is not less than 1.1 nm and not more than 3 nm.

5. The magnetic memory according to claim 1,
wherein said first underlayer includes any of Ti, Zr, Nb, Mo, Hf, Ta and W or alloy consisting of a plurality of materials selected from Ti, Zr, Nb, Mo, Hf, Ta and W.

6. The magnetic memory according to claim 5,
wherein said first underlayer includes at least Ta.

7. The magnetic memory according to claim 1,
wherein said second underlayer includes any of Cu, Rh, Pd, Ag, Ir, Pt and Au or alloy consisting of a plurality of materials selected from Cu, Rh, Pd, Ag, Ir, Pt and Au.

8. The magnetic memory according to claim 7,
wherein said second underlayer includes at least one material of Pt and Pd.

9. The magnetic memory according to claim 1, wherein said data storage layer comprises at least two Co/Ni laminated films.

10. The magnetic memory according to claim 9, wherein said at least two CO/Ni laminated films comprise a first layer which includes Co and a second layer which includes Ni, and
wherein the first layer is formed on a side of the at least two Co/Ni laminated films which is directed to that second underlayer.

11. The magnetic memory according to claim 9, wherein the second layer is formed on an upper side of the first layer.

* * * * *